US011817329B2

(12) United States Patent
Hsu et al.

(10) Patent No.: US 11,817,329 B2
(45) Date of Patent: Nov. 14, 2023

(54) CHEMICAL DISPENSING SYSTEM

(71) Applicant: Taiwan Semiconductor Manufacturing Company Limited, Hsinchu (TW)

(72) Inventors: Ming-Chieh Hsu, Hsinchu (TW); Yung-Long Chen, New Taipei (TW); Fang-Pin Chiang, Taichung (TW); Feng-An Yang, Hsinchu (TW); Ching-Jung Hsu, Hsinchu (TW); Chi-Tung Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 481 days.

(21) Appl. No.: 16/887,647

(22) Filed: May 29, 2020

(65) Prior Publication Data
US 2021/0375645 A1 Dec. 2, 2021

(51) Int. Cl.
*H01L 21/67* (2006.01)
*H01L 21/306* (2006.01)

(52) U.S. Cl.
CPC ...... *H01L 21/67017* (2013.01); *H01L 21/306* (2013.01)

(58) Field of Classification Search
CPC ............ H01L 21/67017; H01L 21/306; H01L 21/67253; H01L 21/67276; Y10T 137/3127
See application file for complete search history.

(56) References Cited

U.S. PATENT DOCUMENTS

| | | | | |
|---|---|---|---|---|
| 5,024,766 A | * | 6/1991 | Mahmud | C02F 1/008 210/806 |
| 5,148,945 A | * | 9/1992 | Geatz | H01L 21/67276 222/61 |
| 5,417,346 A | * | 5/1995 | Ferri, Jr. | H01L 21/67276 222/61 |
| 5,832,948 A | * | 11/1998 | Schell | F04F 10/00 137/142 |
| 6,224,252 B1 | * | 5/2001 | Munroe | B01F 33/80 366/132 |

* cited by examiner

*Primary Examiner* — Reinaldo Sanchez-Medina
*Assistant Examiner* — Nicole Gardner
(74) *Attorney, Agent, or Firm* — Harrity & Harrity, LLP

(57) ABSTRACT

A chemical dispensing system is capable of simultaneously supplying a semiconductor processing chemical for production and testing through the use of independent chemical supply lines, which reduces production downtime of an associated semiconductor process, increases throughput and capability of the semiconductor process, and/or the like. Moreover, the capability to simultaneously supply the semiconductor processing chemical for production and testing allows for an increased quantity of semiconductor processing chemical batches to be tested with minimal impact to production, which increases quality control over the semiconductor processing chemical. In addition, the independent chemical supply lines may be used to supply the semiconductor processing chemical to production while independently filtering semiconductor processing chemical directly from a storage drum through a filtration loop.

20 Claims, 26 Drawing Sheets

CHEMICAL DISPENSING SYSTEM

BACKGROUND

Semiconductor processing chemicals may be supplied via a chemical dispending system for various types of semiconductor processes, such as wet etching, lithography, chemical vapor deposition, physical vapor deposition, and/or the like. A chemical dispending system may include various types of storage containers for storing semiconductor processing chemicals. For example, a chemical dispending system may include a storage drum for storing bulk semiconductor processing chemical, a day tank for storing semiconductor processing chemical for daily use, and/or the like. The semiconductor processing chemical may be pumped from the day tank to a production point of use, where the semiconductor processing chemical is used as part of a semiconductor process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
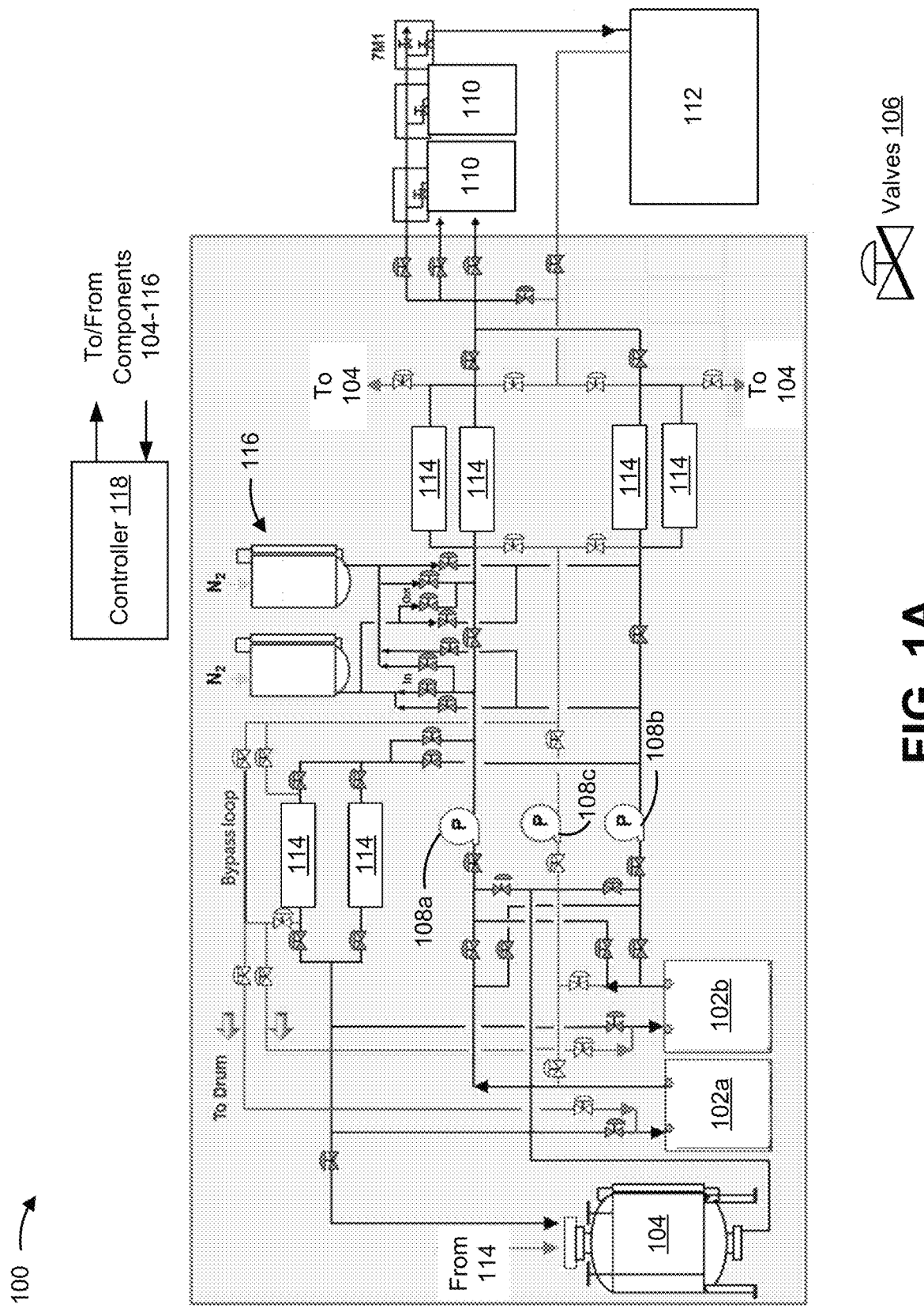
FIGS. 1A and 1B are diagrams of an example chemical dispensing system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Wafer defects can occur as a result of using a semiconductor processing chemical having impurities and other defects in a semiconductor process. While a chemical dispensing system may include one or more filters to filter out contaminants and other impurities, not every batch of semiconductor processing chemical may be inspected because the chemical dispensing system might not be capable of supporting testing and production in parallel. To test a batch of semiconductor processing chemical, supply to a production process is stopped, and the chemical dispensing system is transitioned to supply a semiconductor processing test. The process of switching the chemical dispensing system from production to test and back, and the process of testing itself, are time-consuming processes that would greatly decrease the productivity of the semiconductor processes supplied by the chemical dispensing system if each new batch of semiconductor processing chemical were tested.

Some implementations described herein provide a chemical dispensing system that is capable of simultaneously supplying a semiconductor processing chemical for production and testing. The chemical dispensing system includes a first pump that pumps a semiconductor processing chemical from a day tank and through a first chemical supply line, and a second pump that pumps a semiconductor processing chemical from a storage drum and through a second chemical supply line. The first chemical supply line and the second chemical supply line are independent chemical supply lines that are capable of being configured to simultaneously supply the semiconductor processing chemical to a production point of use (POU) for a semiconductor process and a test POU for testing.

In this way, the independent chemical supply lines permit production and testing to be performed in parallel, which reduces production downtime of the semiconductor process, increases throughput and capability of the semiconductor process, and/or the like. Moreover, the capability to simultaneously supply the semiconductor processing chemical for production and testing allows for an increased quantity of semiconductor processing chemical batches to be tested with minimal impact to production, which increases quality control over the semiconductor processing chemical.

In addition, the independent chemical supply lines may be used to supply the semiconductor processing chemical to production while independently filtering semiconductor processing chemical directly from a storage drum instead of from a day tank. Since the supply of the semiconductor processing chemical in the day tank is consumed for daily production, it is difficult to maintain an even supply quality of the semiconductor processing chemical due to uneven filtering. Semiconductor processing chemical that is consumed early on may be filtered fewer times relative to semiconductor processing chemical that is consumed later on, which may lead to inconsistent levels of quality of the semiconductor processing chemical. With the independent chemical supply lines, the chemical dispensing system is capable of supplying semiconductor processing chemical from the storage drum to a filtration loop prior to being provided to the day tank. In this way, the semiconductor processing chemical in the day tank is filtered evenly, which increases the quality of the semiconductor processing chemical.

Figure 1B:
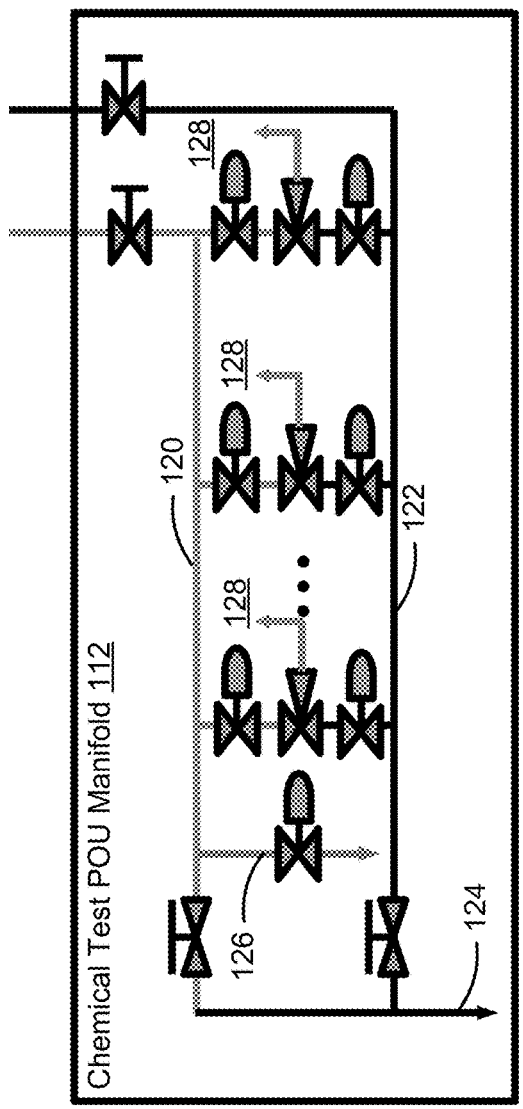
Figure 1B:
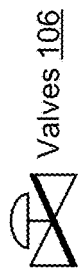

FIGS. 1A and 1B are diagrams of an example chemical dispensing system 100 described herein. In some implementations, chemical dispensing system 100 may also be referred to as a chemical dispense unit (CDU), a chemical dispense system (CDS), a chemical supply system, or another system that is capable of supplying a semiconductor processing chemical for one or more types of semiconductor processes, such as wet etching, lithography, chemical vapor deposition, physical vapor deposition, and/or the like. The semiconductor processing chemical may include a liquid, a gas, a slurry, and/or another form of chemical. Examples of semiconductor processing chemicals that may be supplied by chemical dispensing system 100 include (but are not limited to) argon, oxygen, hydrofluoric acid, phosphoric acid, ammonium fluoride, various halides, various hydrides, various nitrides, precursor materials, buffering agents, combinations thereof, and/or many other chemicals used in various semiconductor processes.

As shown in FIG. 1A, chemical dispensing system 100 may include various components, such as one or more storage drums 102, one or more day tanks 104, a plurality of valves 106, a plurality of pumps 108, one or more production point of use (POU) manifolds 110, one or more chemical test POU manifolds 112, a plurality of filters 114, one or more pressure tanks 116, one or more controllers 118, and/or the like. Moreover, chemical dispensing system 100 may include various types and configurations of plumbing fixtures for transporting, supplying, and/or otherwise providing a semiconductor processing chemical to the various components of chemical dispensing system 100, such as pipes (e.g., copper pipes, galvanized steel pipes, cast iron pipes, polyvinyl chloride (PVC) pipes, and/or the like), fittings (e.g., couplings, elbows, reducers, expanders, unions, cross fittings, tee fittings, Y fittings, and/or the like), and/or the like.

Storage drums 102 (e.g., storage drum 102a, storage drum 102b, and/or the like) include one or more storage drums, one or more storage containers, one or more storage vessels, or one or more other types of apparatuses capable of storing semiconductor processing chemical (e.g., bulk or raw semiconductor processing chemical). In some implementations, storage drums 102 may be capable of storing semiconductor processing chemical for various duration lengths, such as a plurality of days, a plurality of weeks, a plurality of months, and/or the like. Storage drums 102 may be capable of holding various amounts of semiconductor processing chemical, such as 100 liters, 200 liters, and/or the like.

In some implementations, a storage drums 102 may be capable of operating in various modes, such as a supply mode in which the storage drum 102 is supplying semiconductor processing chemical to various components of chemical dispensing system 100, a standby mode in which the storage drum 102 is not supplying semiconductor processing chemical, and/or the like. In some implementations, a storage drum 102 (e.g., storage drum 102a) may be configured to operate in a supply mode while another storage drum 102 (e.g., storage drum 102b) is configured to operate in a standby mode. In this way, a storage drum 102 in supply mode may supply semiconductor processing chemical to various components of chemical dispensing system 100 while another storage drum 102 in standby mode may be refilled with semiconductor processing chemical, may be filtered (e.g., the semiconductor processing chemical in the storage drum 102 may be circulated through a filtration loop), and/or the like.

Day tank 104 includes a tank, a drum, a storage container, a storage vessel, or another type of apparatus capable of storing a semiconductor processing chemical for daily use at the one or more production POU manifolds 110, the chemical test POU manifold 112, and/or at one or more other components. In some implementations, day tank 104 may be sized to hold an amount of semiconductor processing chemical that is expected to be consumed for daily use, such as 500 liters or more. In some implementations, day tank 104 has a capacity equal to or greater than a capacity of a storage drum 102.

In some implementations, semiconductor processing chemical is provided to day tank 104 from one or more storage drums 102. In some implementations, the semiconductor processing chemical is filtered through one or more filters 114 prior being added to day tank 104. In some implementations, the semiconductor processing chemical in day tank 104 may be diluted (e.g., relative to the bulk or raw semiconductor processing chemical stored in storage drums 102), may be mixed with additives, and/or the like prior to use at the one or more production POU manifolds 110, the chemical test POU manifold 112, and/or the like.

Valves 106 include various types of plumbing valves made from various types of materials such as copper plumbing valves, PVC valves, cast iron valves, and/or the like. A valve 106 may be capable of permitting the passage of semiconductor processing chemical (e.g., when the valve 106 is configured in an open position) and restricting or blocking the passage of semiconductor processing chemical (e.g., when the valve 106 is configured in a closed position). In this way, valves 106 may be used to direct the flow of semiconductor processing chemical along various flow paths in chemical dispensing system 100, may be used to block or restrict the flow of semiconductor processing chemical so that components such as pumps 108 or filters 114 may be bypassed, removed for maintenance, or replaced, and/or the like. Examples of valves 106 include ball valves, butterfly valves, check valves, pneumatic valves, diaphragm valves, and/or the like.

Pumps 108 include various types of pumps capable of pumping, supplying, and/or otherwise causing semiconductor processing chemical to flow through chemical dispensing system 100. For example, pumps 108 may include centrifugal pumps, in-line pumps, reciprocating pumps, rotary pumps, and/or other types of pumps. Chemical dispensing system 100 may include a plurality of pumps 108 to supply or provide semiconductor processing chemical through a plurality of independent chemical supply lines. In this way, chemical dispensing system 100 is capable of simultaneously supplying or providing semiconductor processing chemical from a plurality of different sources (e.g., day tank 104 and a storage drum 102) to a plurality of different destinations (e.g., a production POU manifold 110 and a chemical test POU manifold 112).

In some implementations, pump 108a and pump 108b may be configured to pump, supply, and/or otherwise cause semiconductor processing chemical in day tank 104 to flow through a chemical supply line of chemical dispensing system 100. In some implementations, pump 108a may be a primary pump for day tank 104, and pump 108b may be a secondary or backup pump for day tank 104 that is used if pump 108a fails, experiences abnormal behavior, or is in the process of being replaced or serviced. Moreover, pump 108c may be configured to pump, supply, and/or otherwise cause semiconductor processing chemical in storage drums 102 to flow through a chemical supply line and/or a filtration loop of chemical dispensing system 100 to various locations, such as day tank 104, production POU manifold 110, chemical test POU manifold 112, and/or the like. Pump 108c is different from and may operate (or be operated) independent of pump 108a and pump 108b.

Production POU manifold(s) 110 includes various types of manifolds or manifold systems capable of supplying or providing a semiconductor processing chemical to a plurality of semiconductor processing POUs for production use. Examples of semiconductor processing POUs include (but are not limited to) a chemical vapor deposition processing chamber, a physical vapor deposition processing chamber, a spin coating machine, a wet etch bath, and/or another location in a semiconductor processing facility where the semiconductor processing chemical is used in a semiconductor process. Chemical test POU manifold 112 includes various types of manifolds or manifold systems capable of supplying or providing a semiconductor processing chemical to a plurality of testing POUs. Examples of testing POUs include (but are not limited to) a test fixture, a test chamber, a lab, and/or the like.

Filters 114 include various types of filters capable of filtering contaminants, foreign material, and/or other types of impurities from a semiconductor processing chemical stored and/or supplied by chemical dispensing system 100. For example, filters 114 may include membrane filters, pleated filters, cylindrical filters, mesh filters, and/or other types of filters capable of filtering liquids and/or gasses. In some implementations, subsets of the filters 114 included in chemical dispensing system 100 may be configured to perform various types of filtrations. For example, one or more filters 114 may be configured to perform loop filtration, recirculation filtration, or another type of filtration in which semiconductor processing chemical is circulated through a filtration loop. As another example, one or more filters 114 may be configured to perform final stage filtration, a one-pass filtration, POU filtration, or another type of filtration in which semiconductor processing chemical is filtered prior to being supplied to a production POU manifold 110 for use in a semiconductor process or a chemical test POU manifold 112 for testing. In some implementations, a portion of the semiconductor processing chemical processed through a final stage filtration may be returned to day tank 104 to ensure an even flow of semiconductor processing chemical to production POU manifold(s) 110 and/or chemical test POU manifold 112.

Pressure tank(s) 116 include one or more tanks, vessels, containers, or other types of apparatuses capable of holding semiconductor processing chemical while the semiconductor processing chemical is pressurized using a pressurized gas (e.g., nitrogen, oxygen, and/or the like). For example pressure tank(s) 116 may each hold 20 liters of semiconductor processing chemical or another volume. The semiconductor processing chemical in pressure tank(s) 116 may be pressurized to maintain an even flow and supply of semiconductor processing chemical to production POU manifold(s) 110 and/or chemical test POU manifold 112.

As shown in FIG. 1B, chemical test POU manifold 112 may include a plurality of valves 106, a chemical test supply line 120, a production supply line 122, a sampling line 124, a flush drain line 126, and/or one or more other components and combinations thereof. Chemical test supply line 120 may supply semiconductor processing chemical (e.g., a raw or bulk supply semiconductor processing chemical) to one or more testing POUs 128 via one or more valves 106. Similarly, production supply line 122 may supply semiconductor processing chemical (e.g., a production semiconductor processing chemical) to one or more testing POUs 128 via one or more valves 106. Valves 106 (e.g., POU valves) may be used to restrict flow of semiconductor processing chemical to particular testing POUs 128, may be used to permit flow of semiconductor processing chemical to particular testing POUs 128, may be used to restrict or permit flow to chemical test supply line 120, production supply line 122, and/or sampling line 124, and/or the like.

Sampling line 124 may be used to directly test the semiconductor processing chemical from production POU manifold(s) 110 and/or chemical test POU manifold 112 for increased quality control sampling. Flush drain line 126 may be used to drain or flush semiconductor processing chemical from chemical test POU manifold 112. Flush drain line 126 may reduce and/or minimize the risk of dead zone residue contamination in chemical test POU manifold 112.

The number and arrangement of components shown in FIGS. 1A and 1B are provided as an example. In practice, chemical dispensing system 100 may include additional components, fewer components, different components, or differently arranged components than those shown in FIGS. 1A and/or 1B. Additionally, or alternatively, a set of components (e.g., one or more components) of chemical dispensing system 100 may perform one or more functions described as being performed by another set of components of chemical dispensing system 100.

Figure 2A:
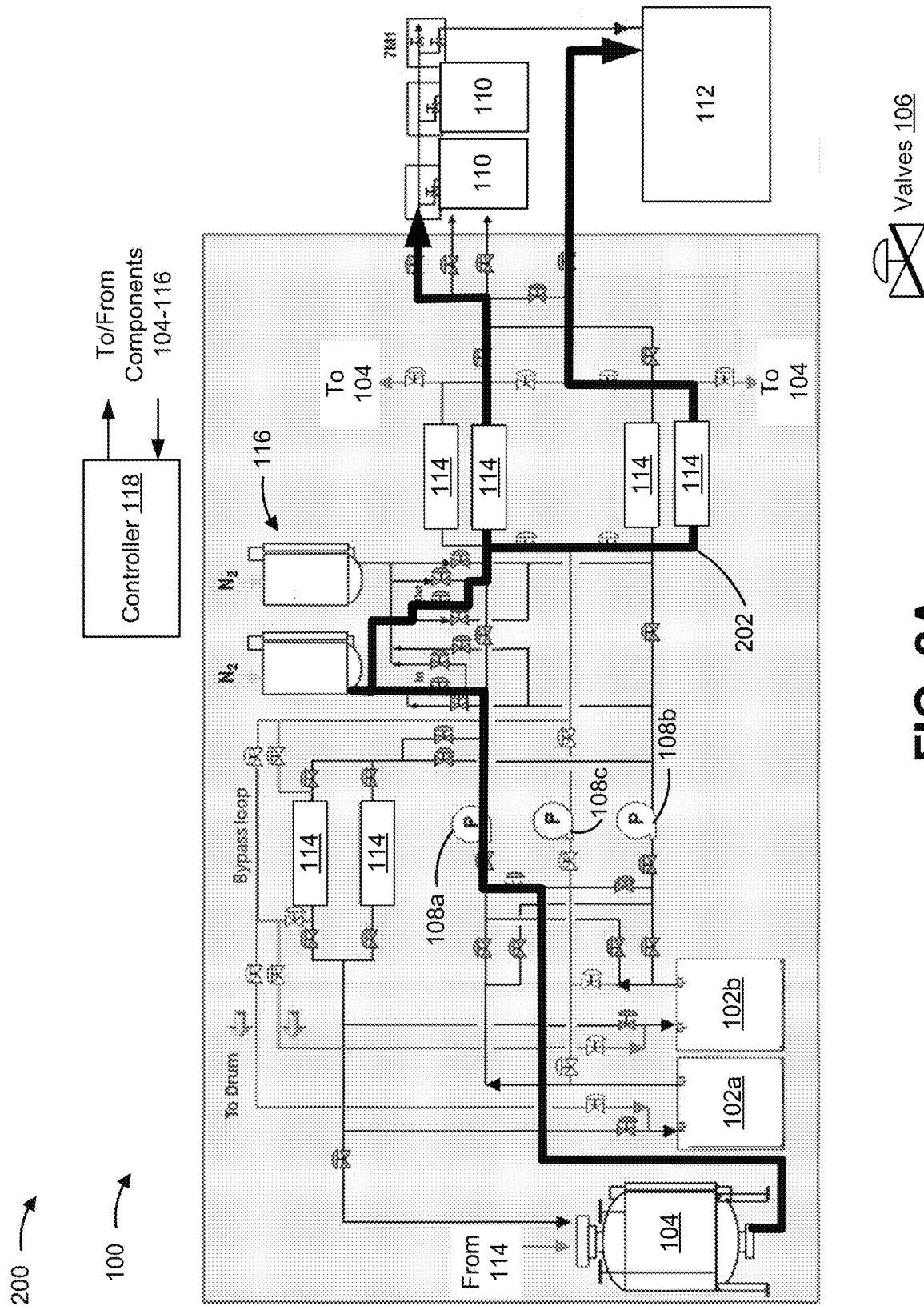
FIGS. 2A-2R are diagrams of example implementations described herein.
Figure 2B:
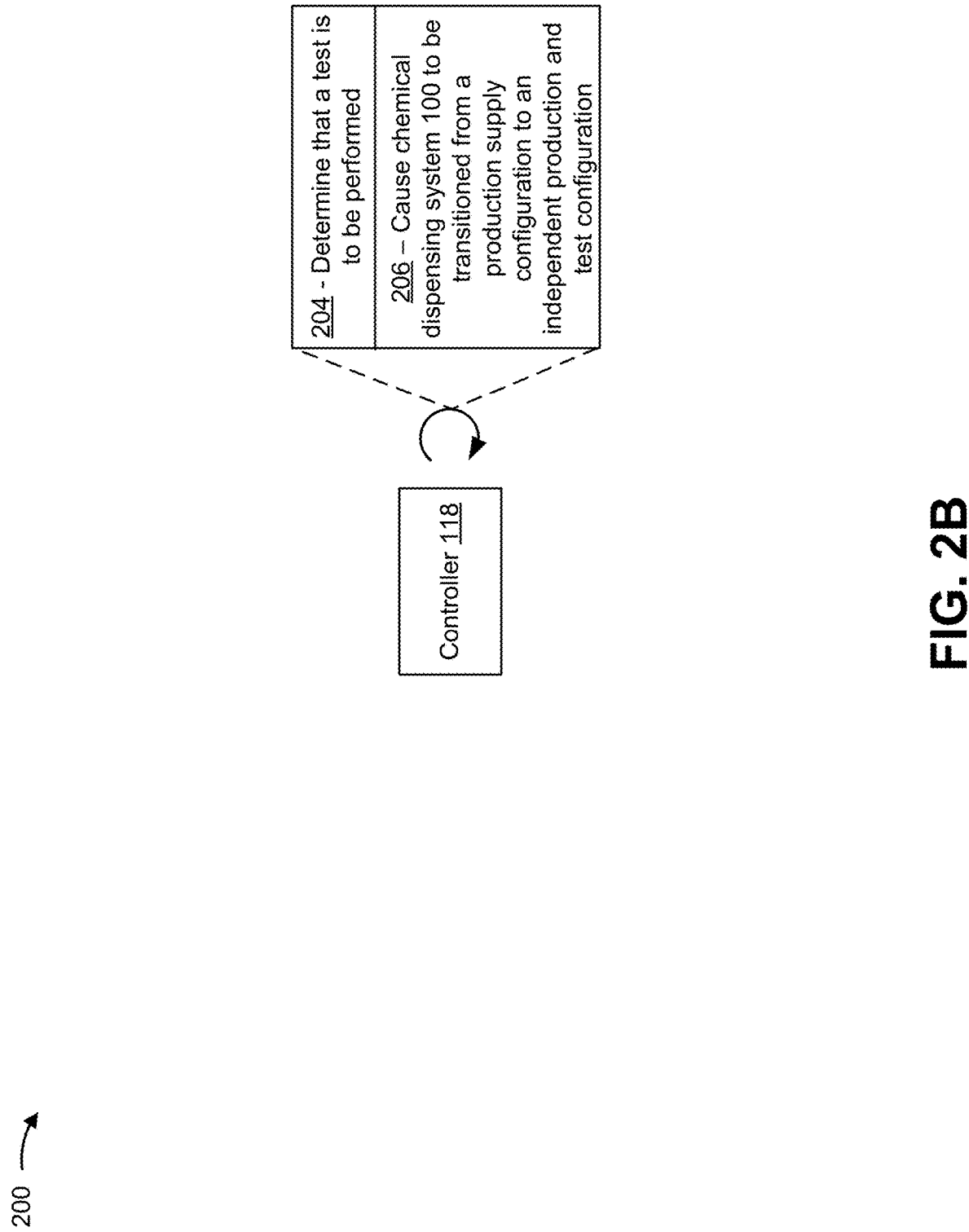
Figure 2C:
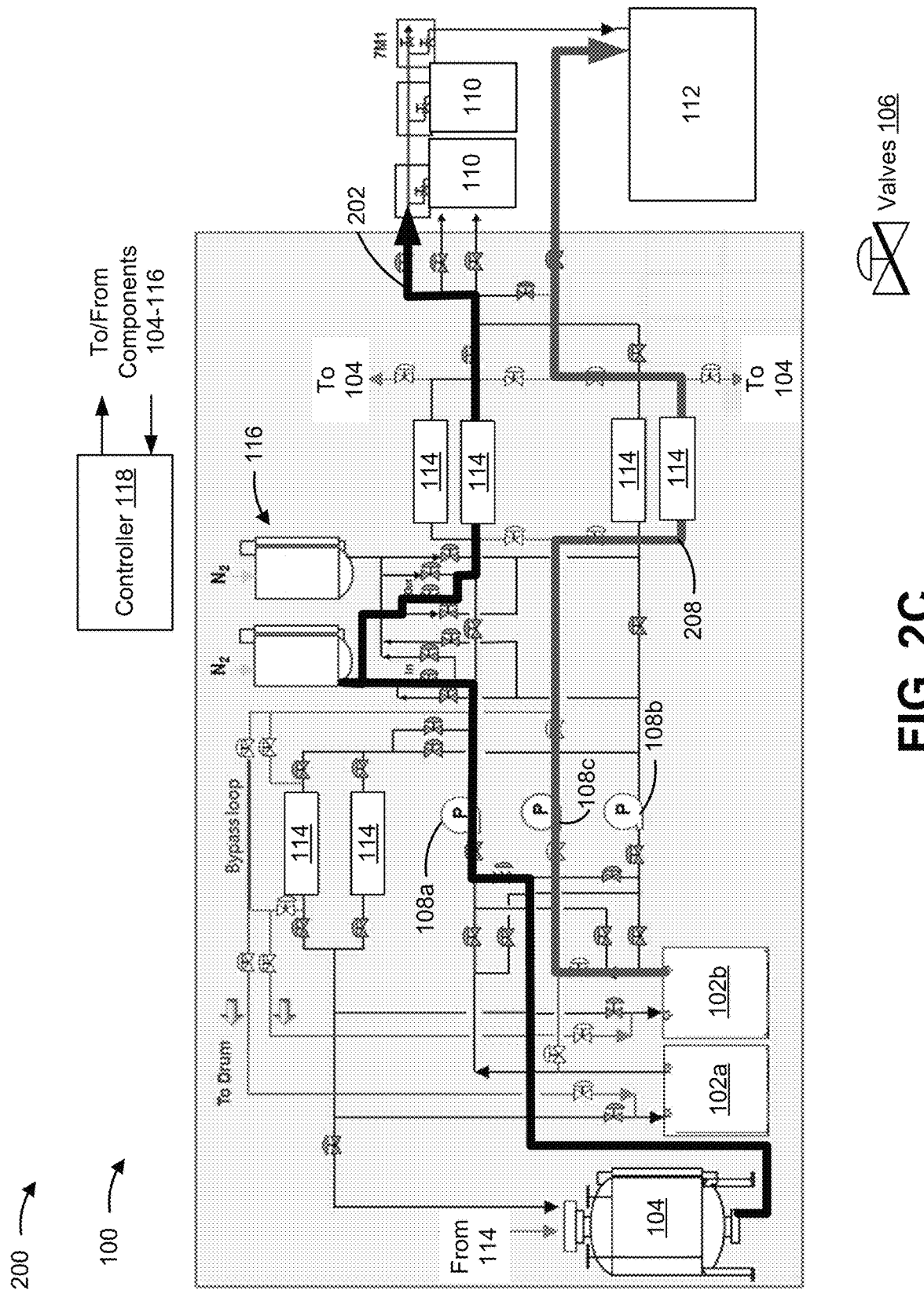
Figure 2D:
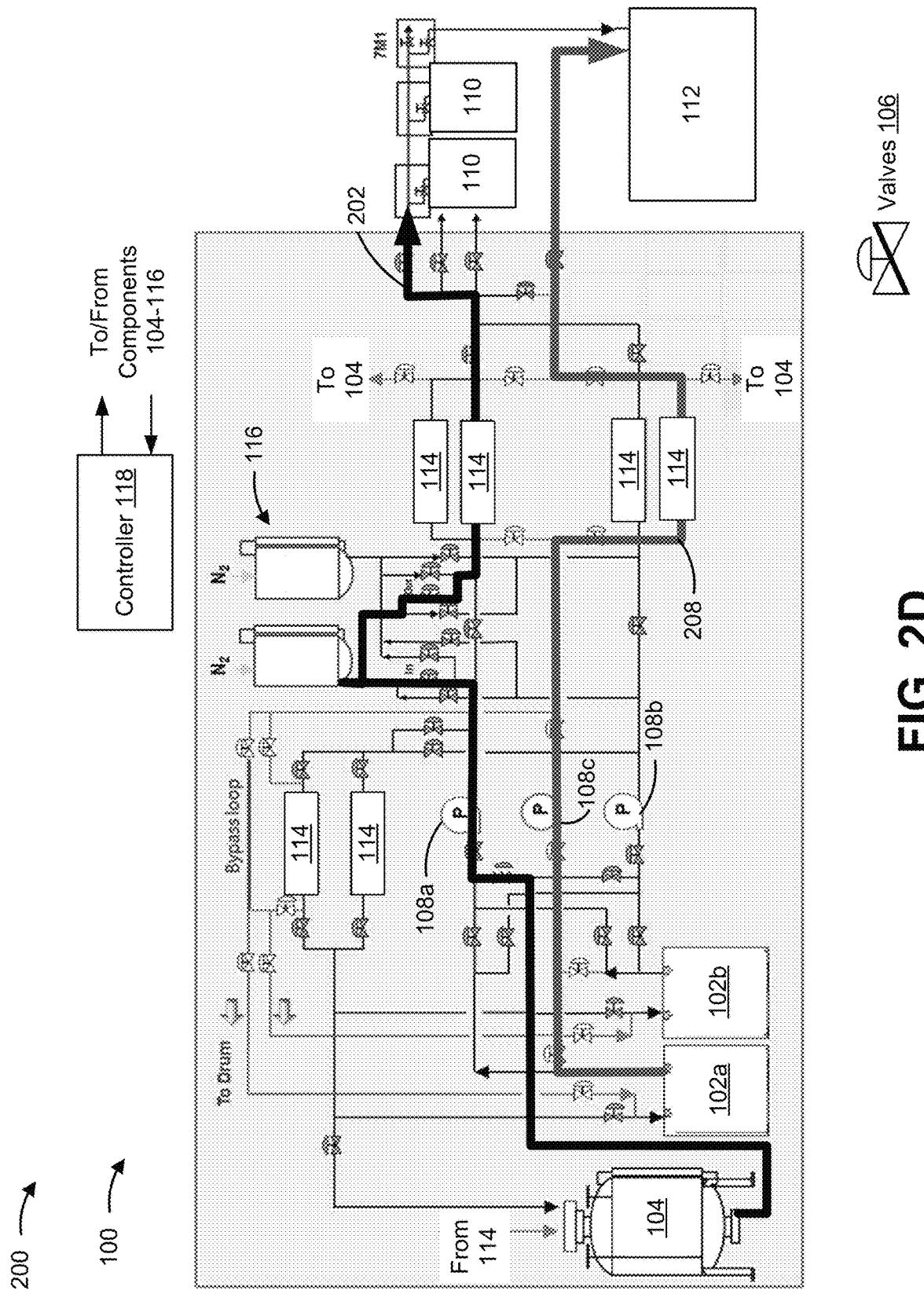
Figure 2E:
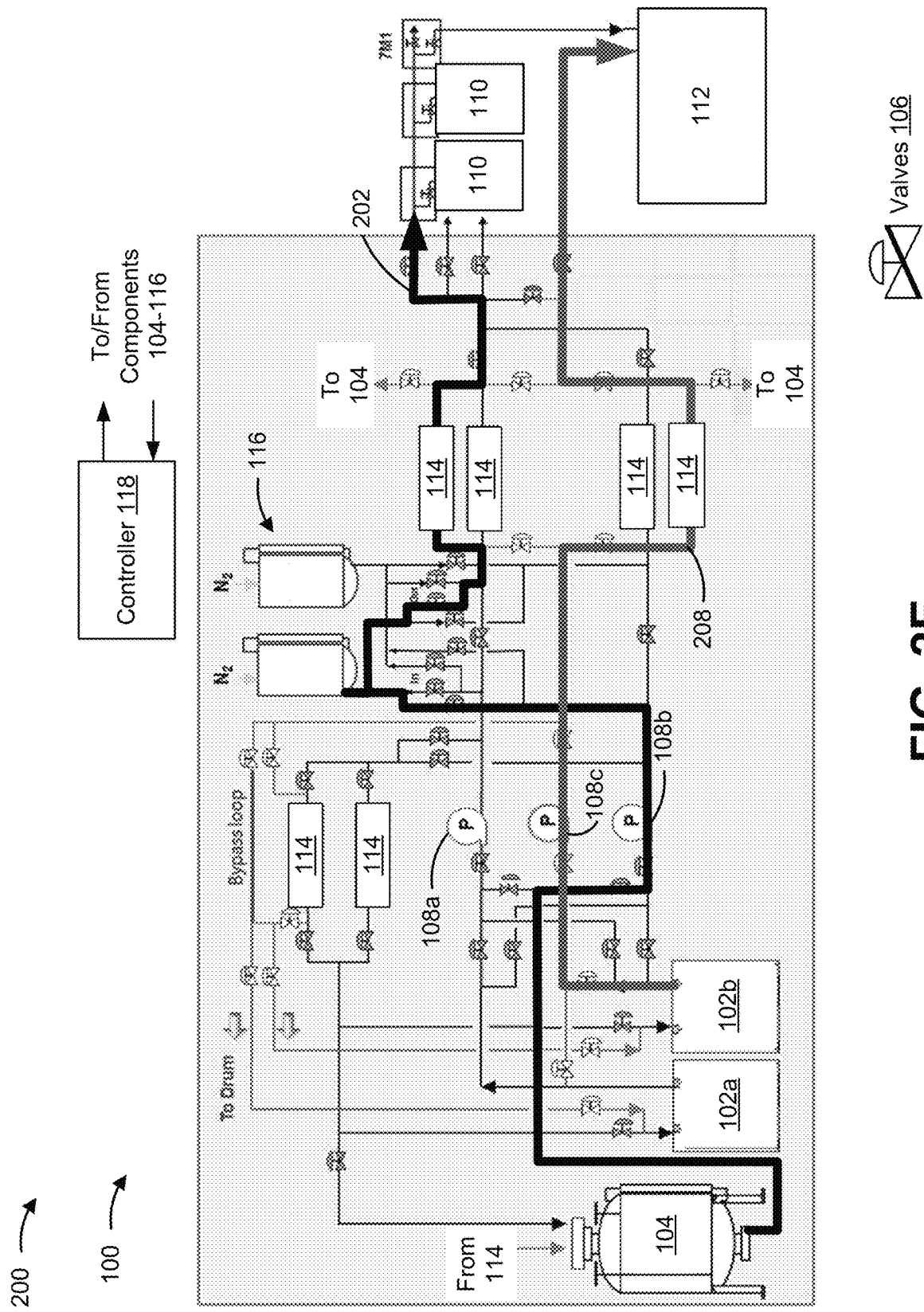
Figure 2F:
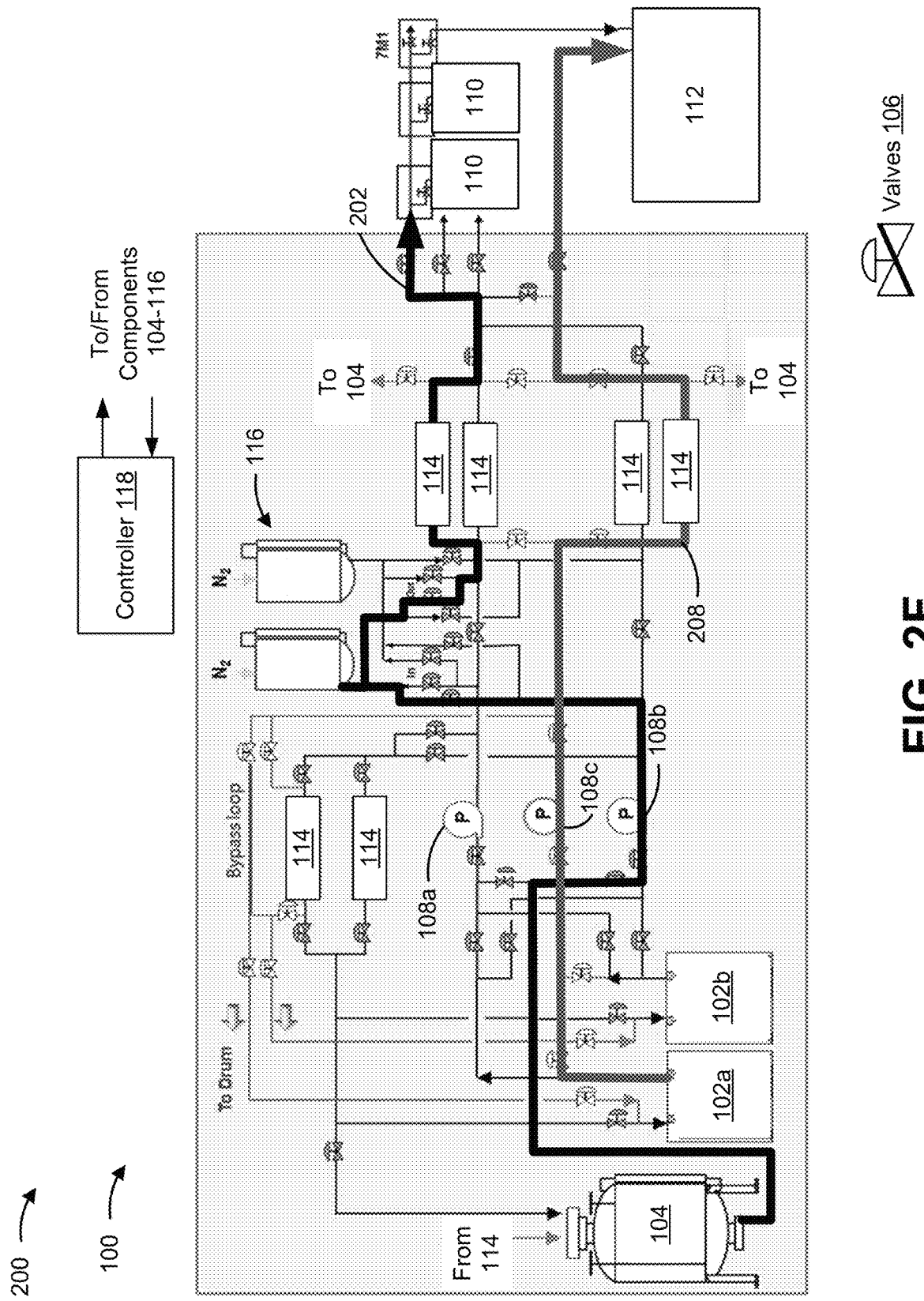
Figure 2G:
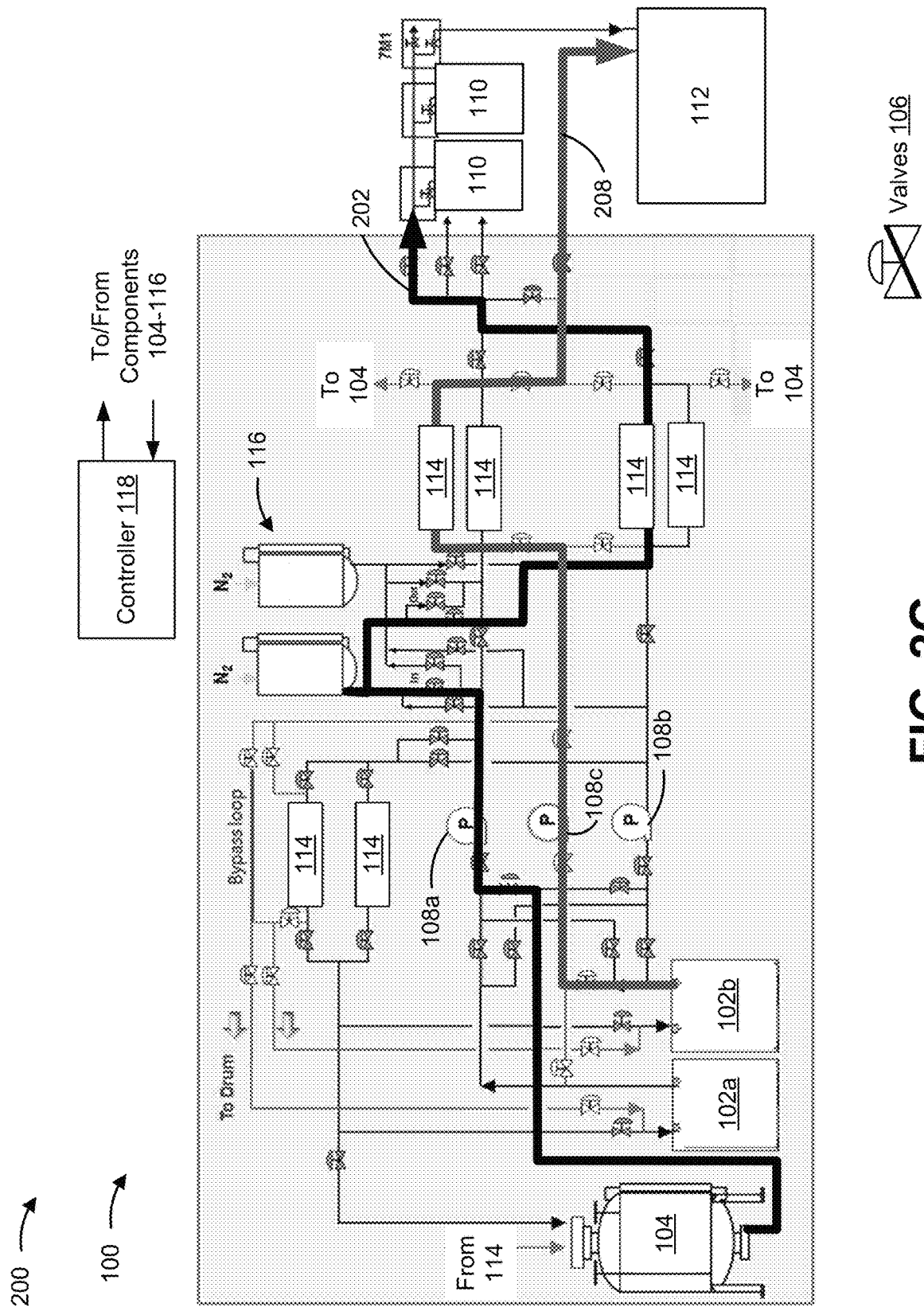
Figure 2H:
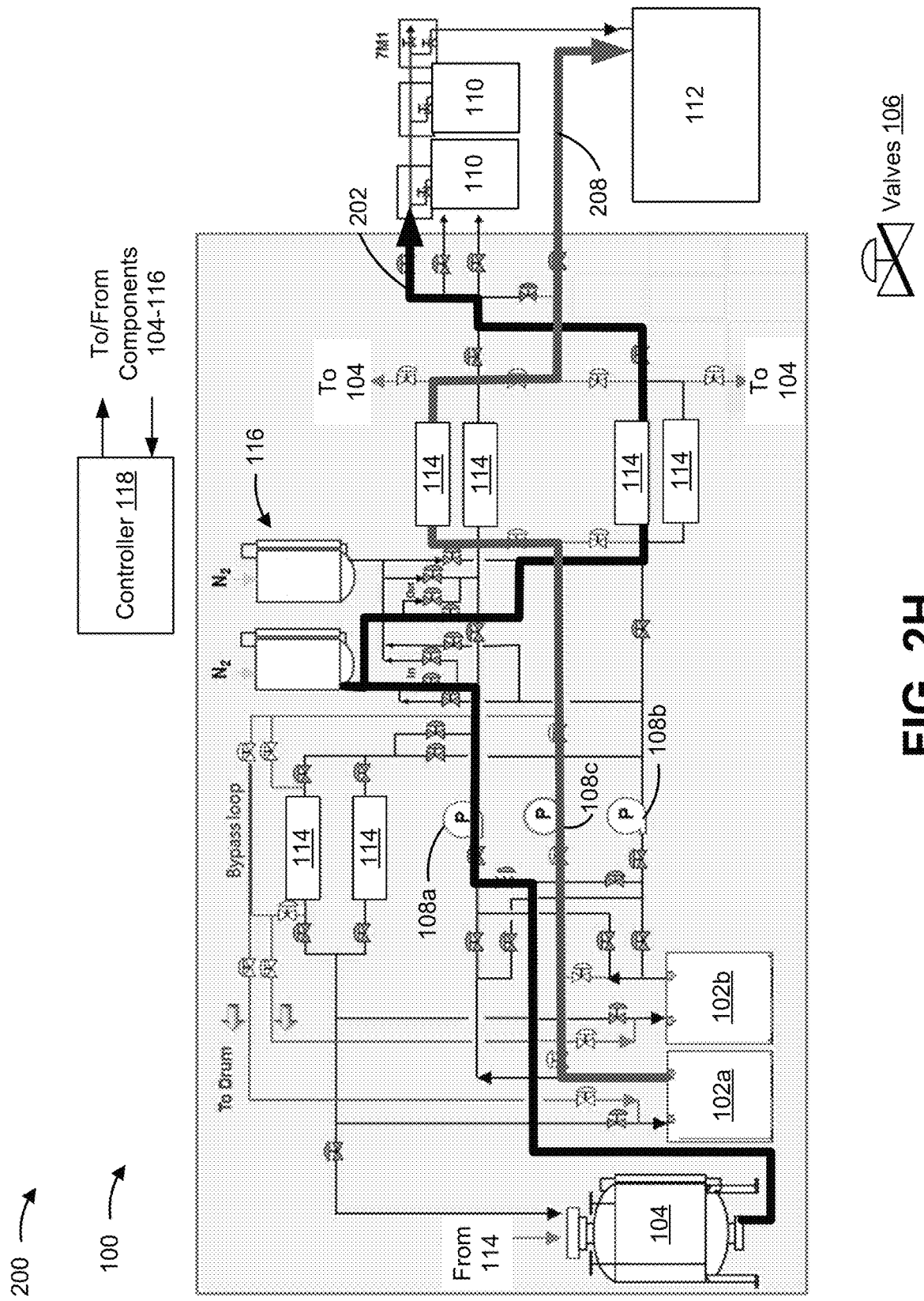
Figure 2I:
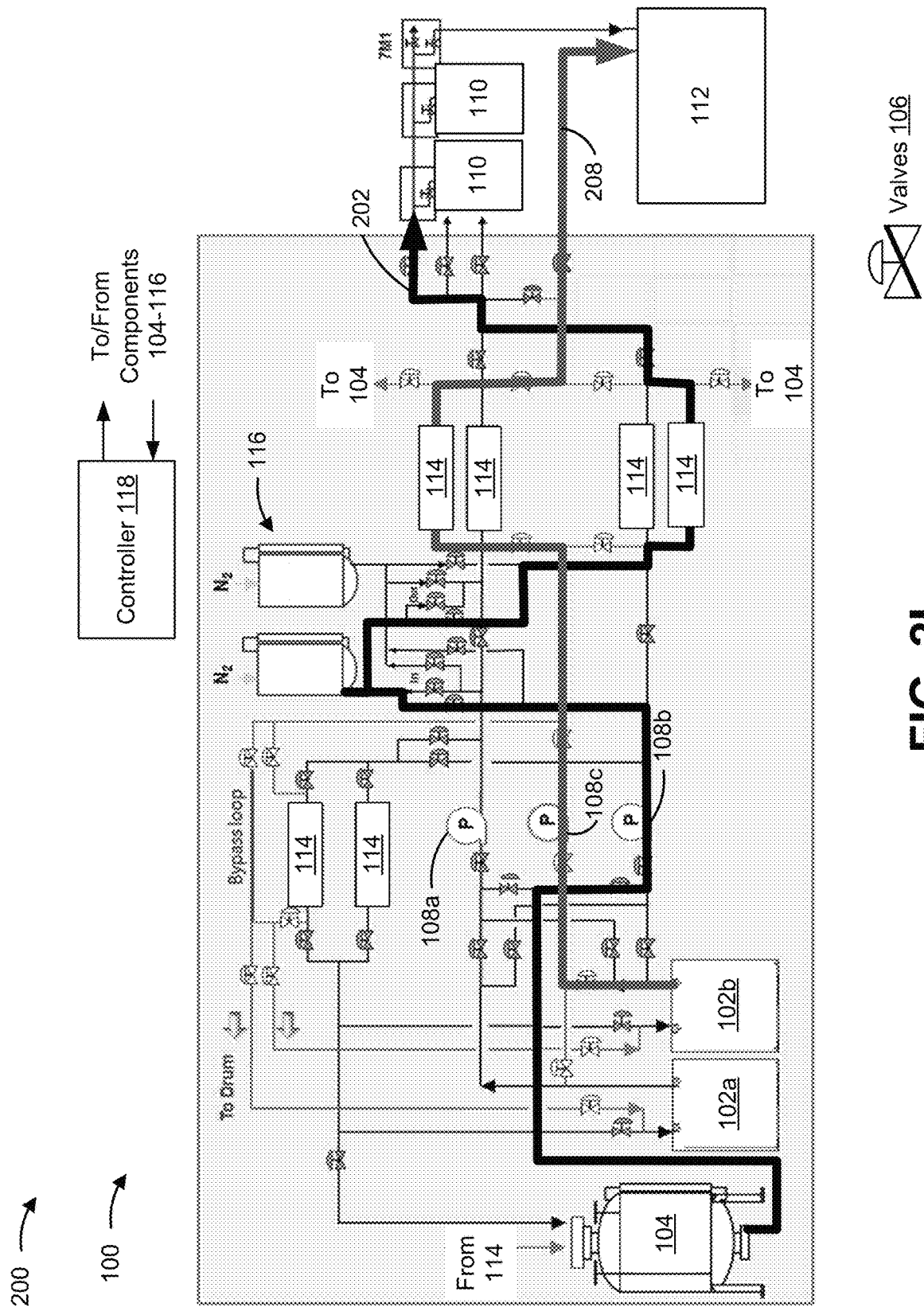
Figure 2J:
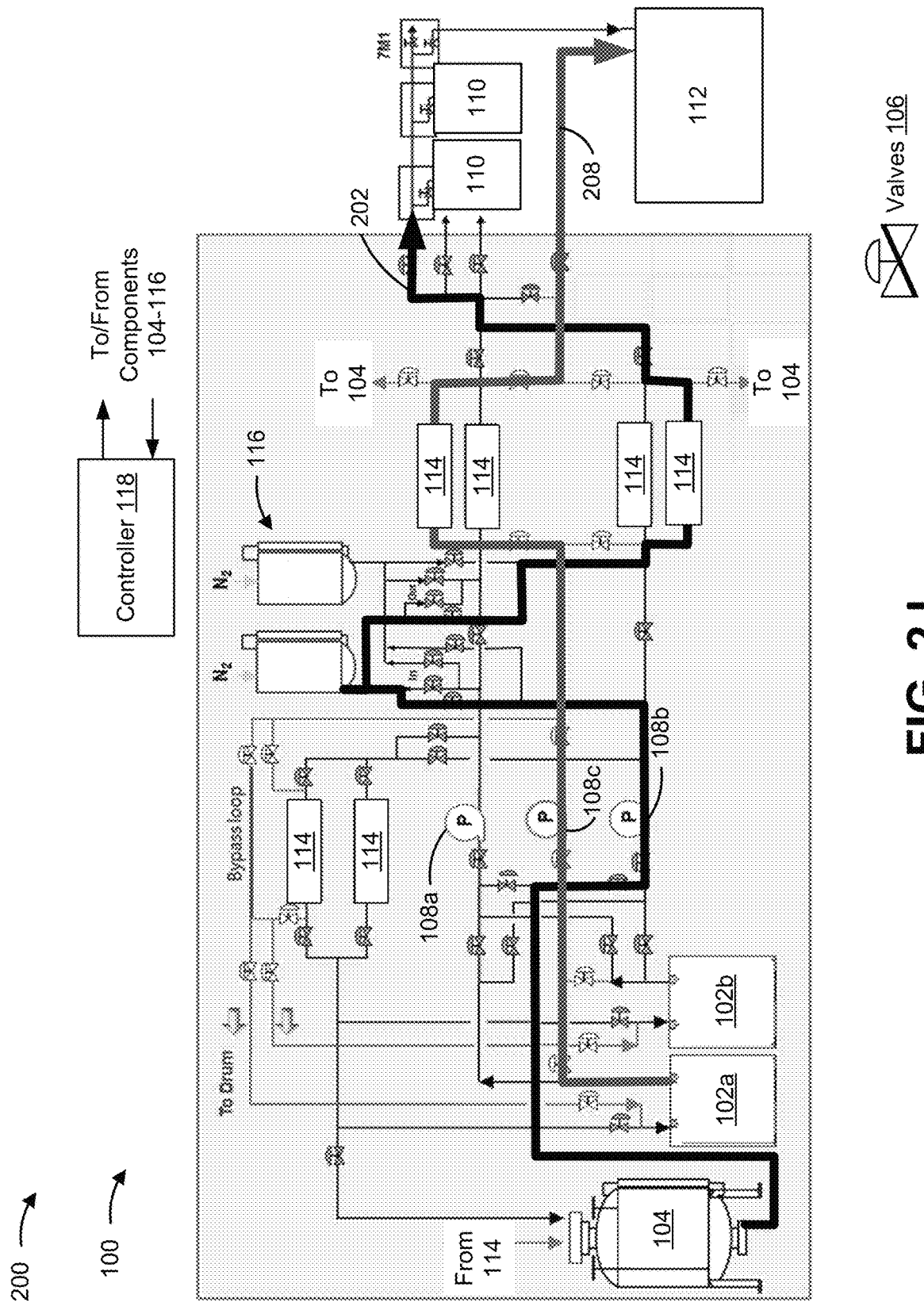
Figure 2K:
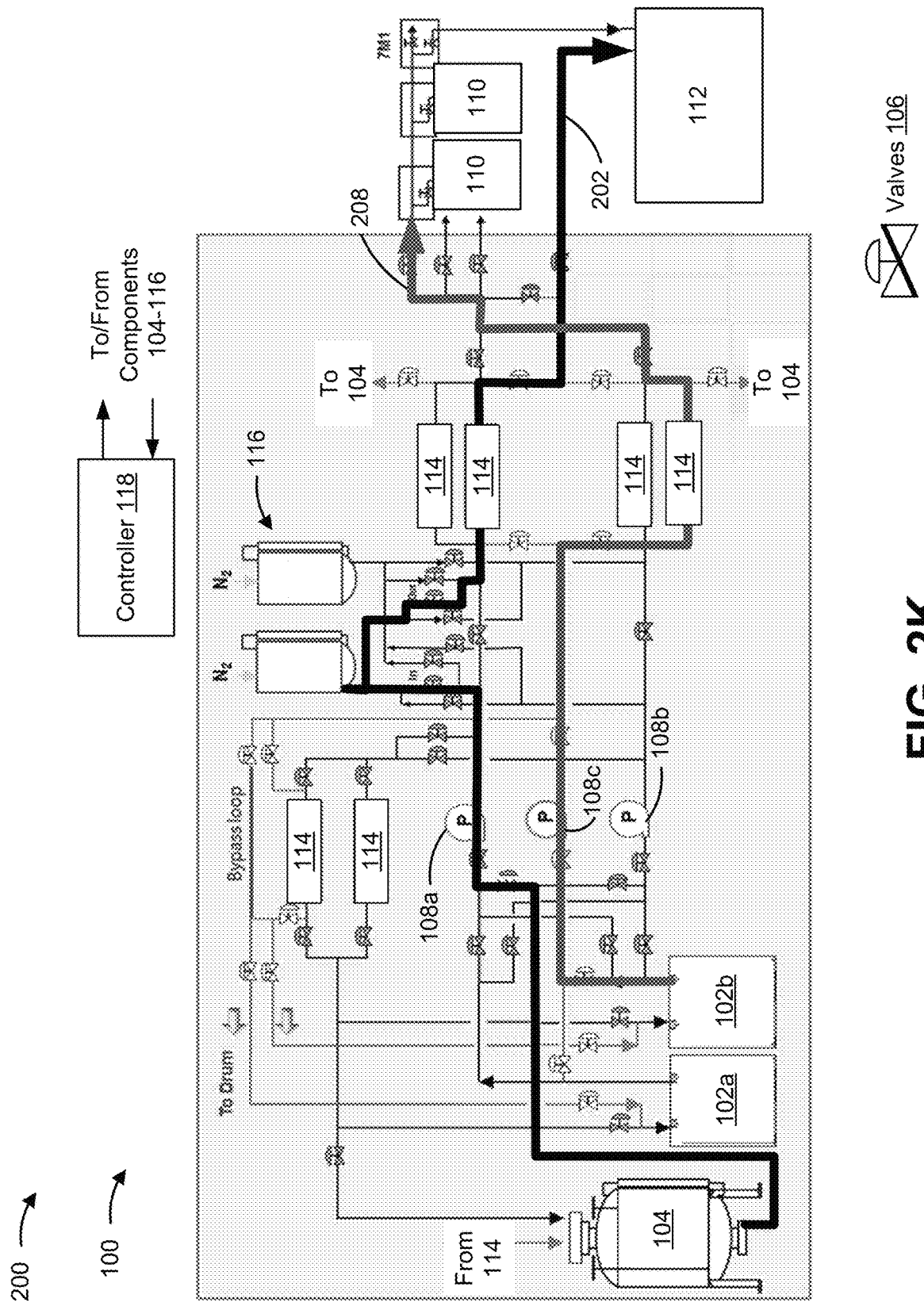
Figure 2L:
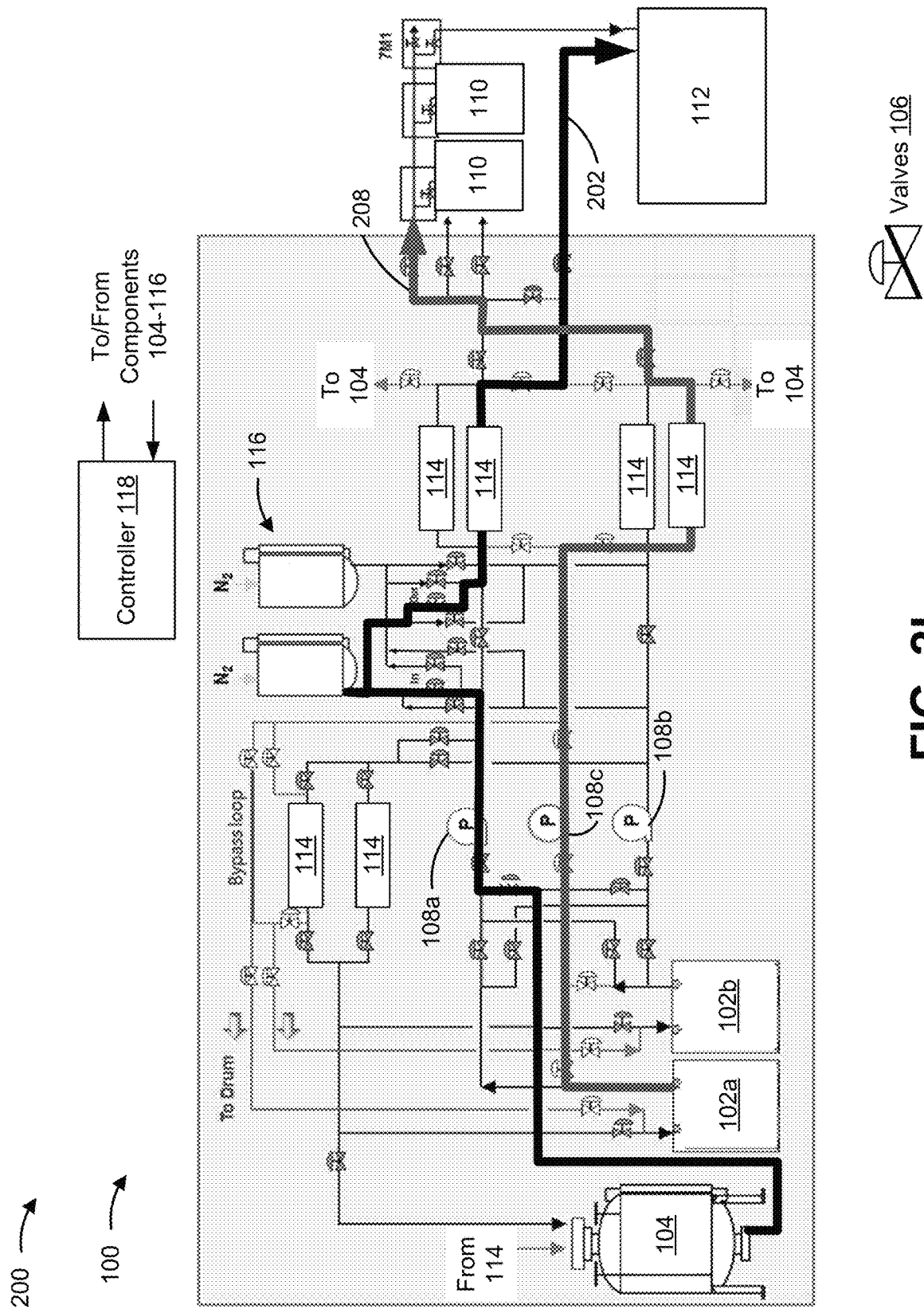
Figure 2M:
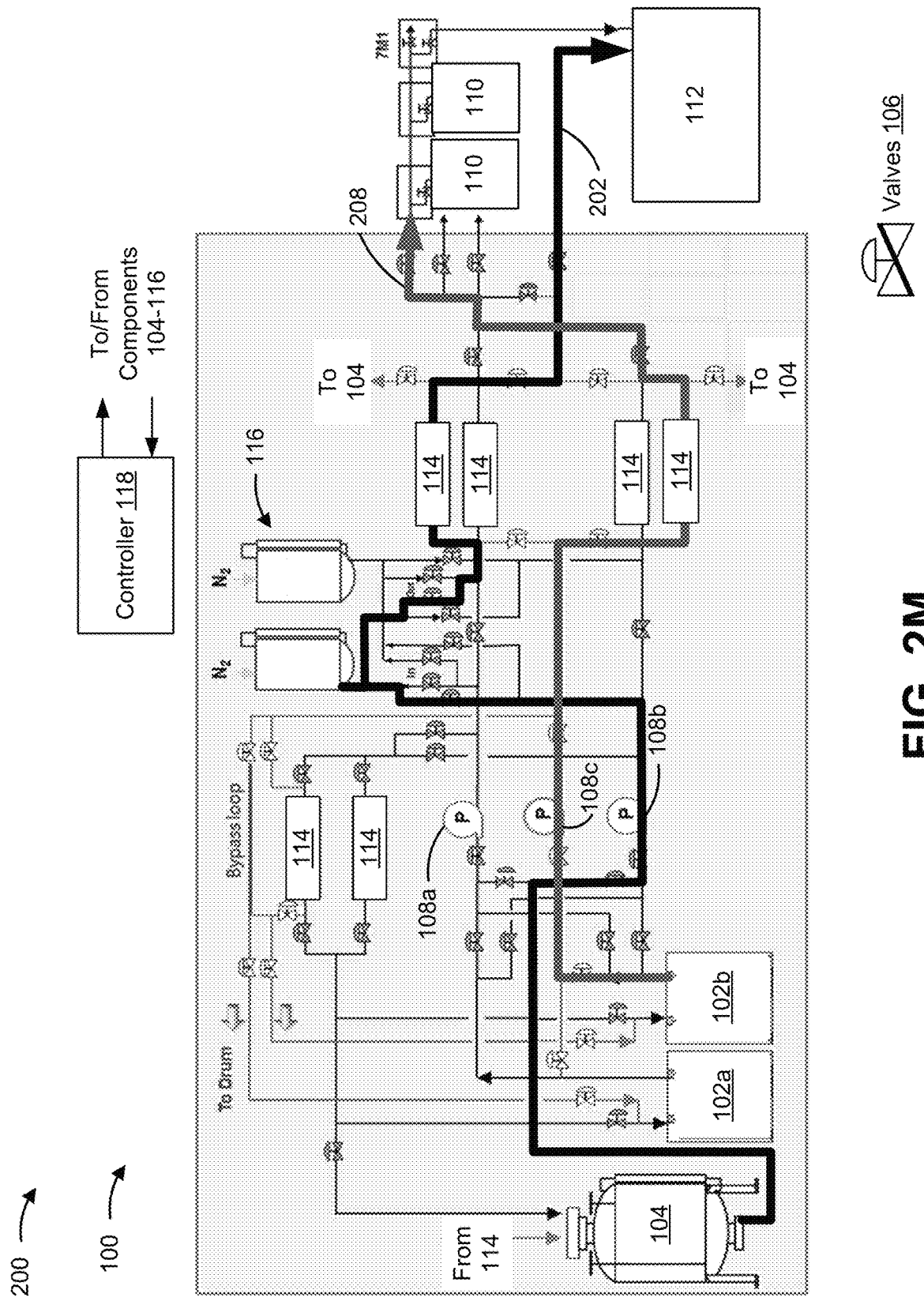
Figure 2N:
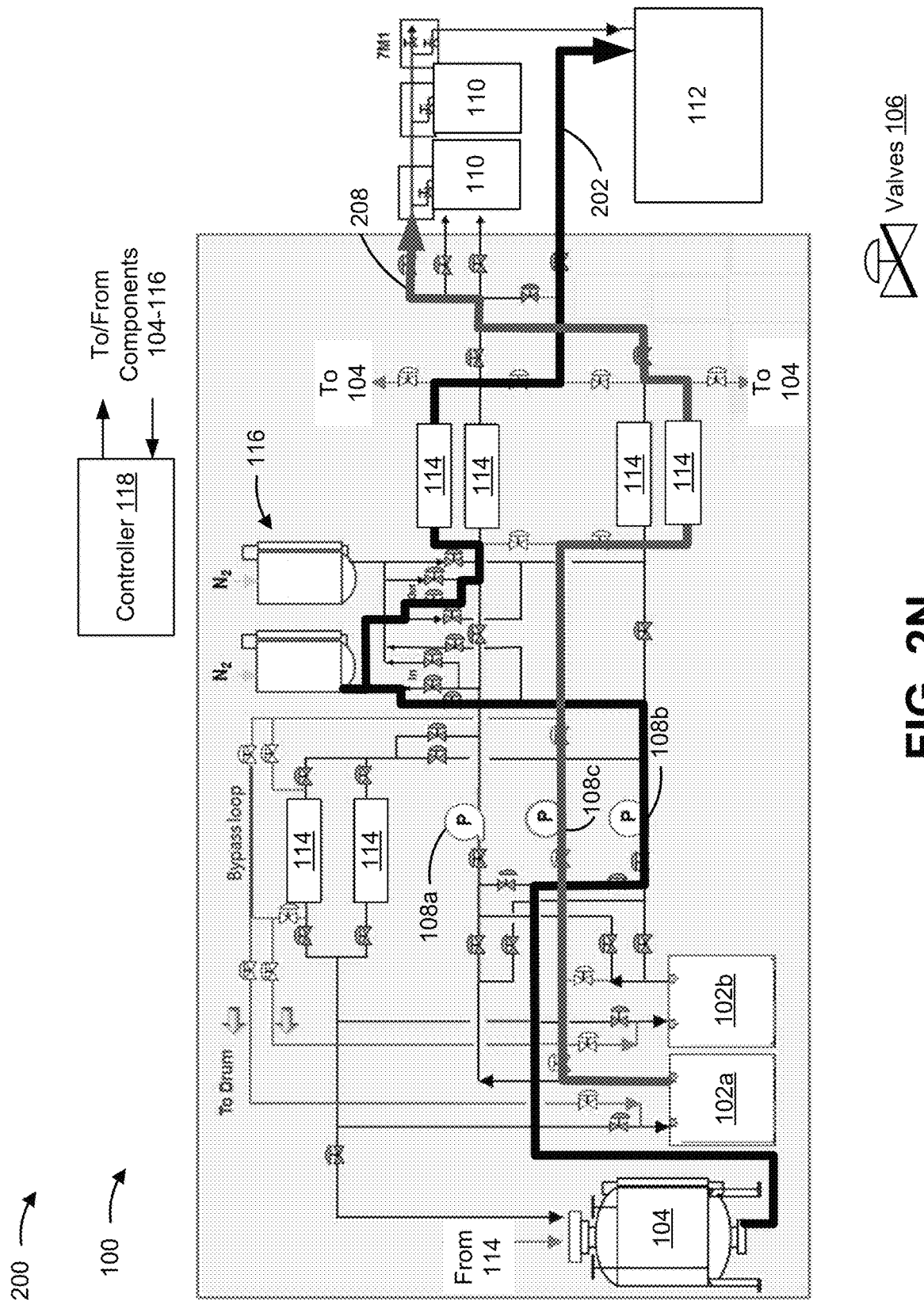
Figure 2O:
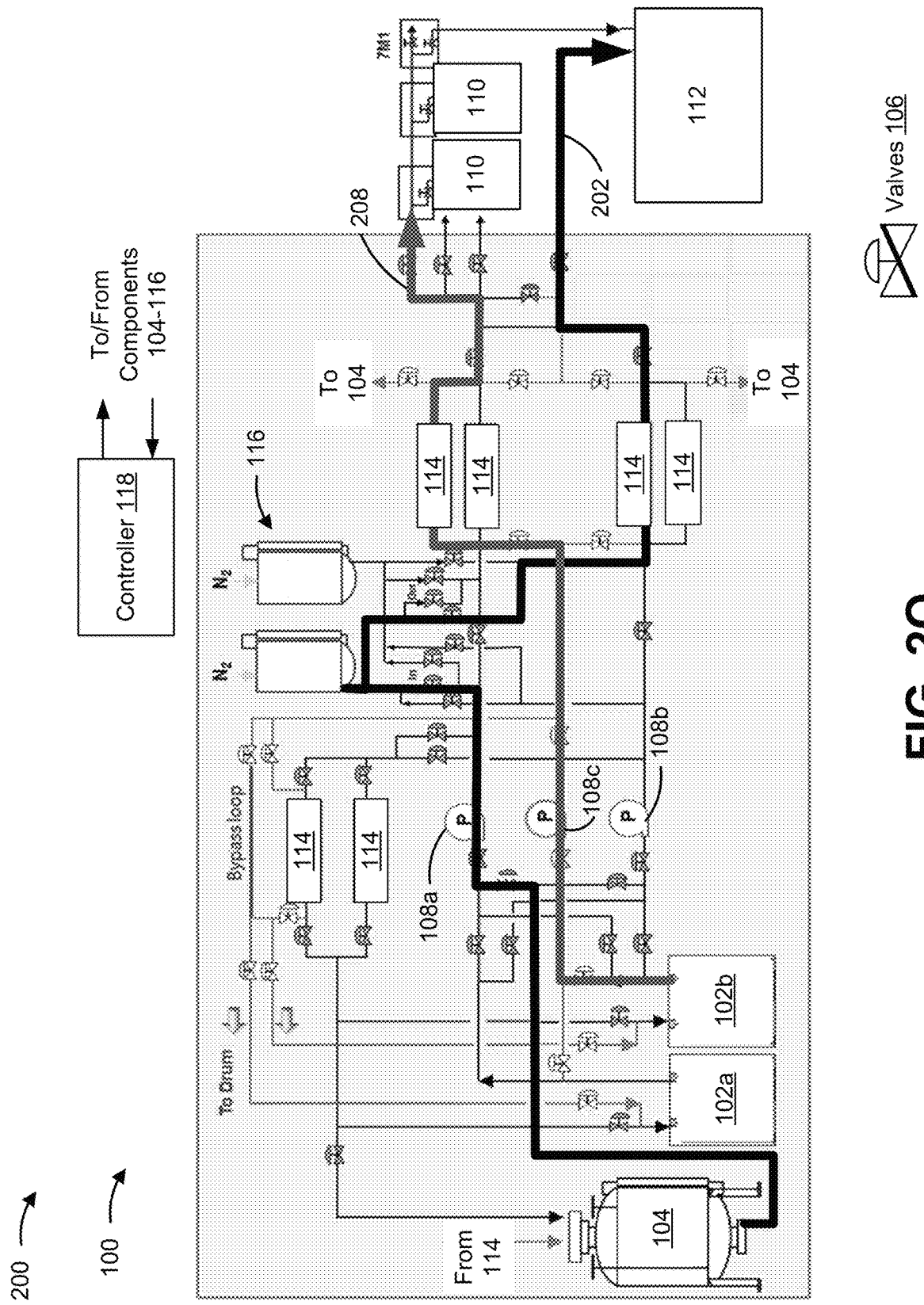
Figure 2P:
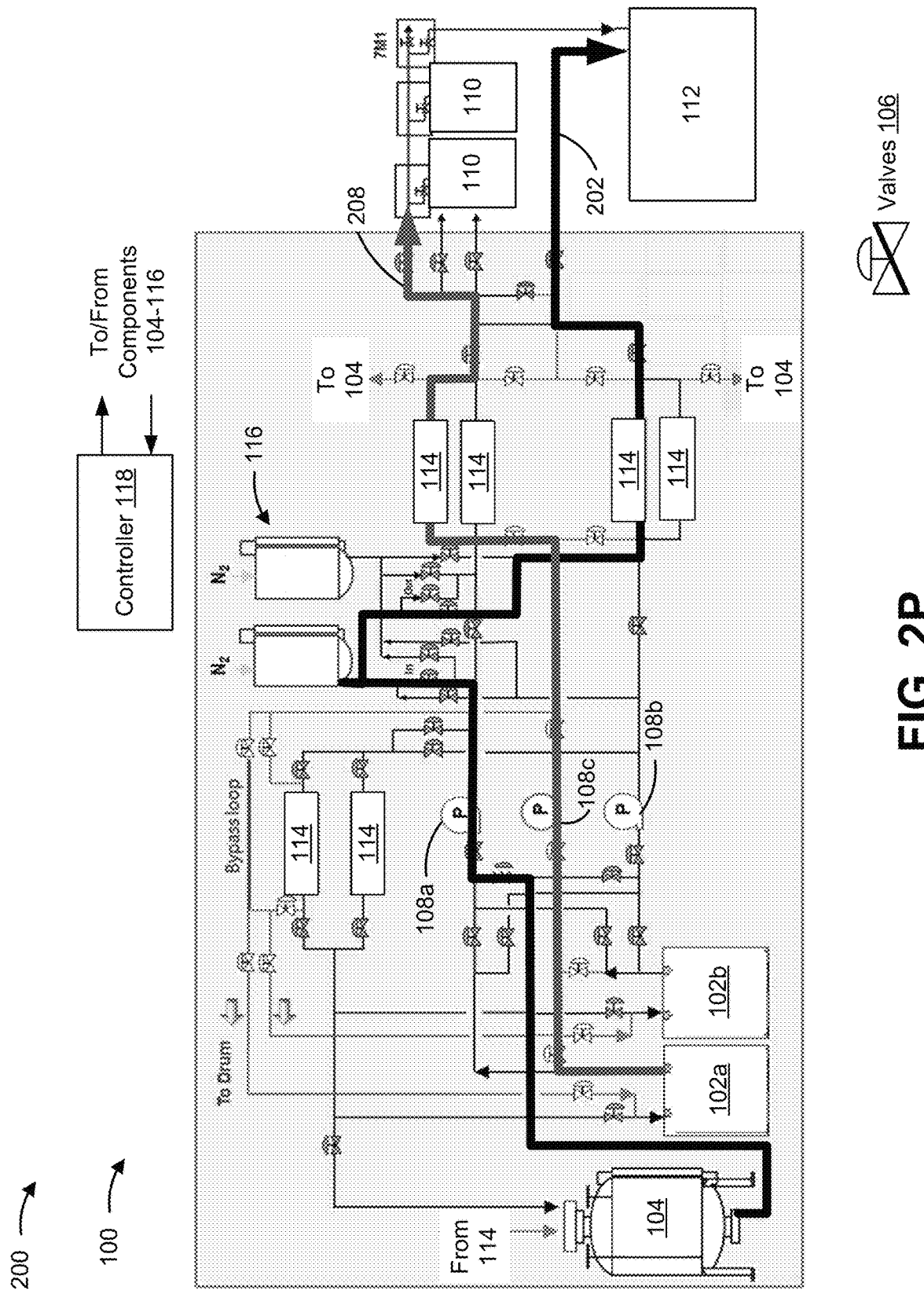
Figure 2Q:
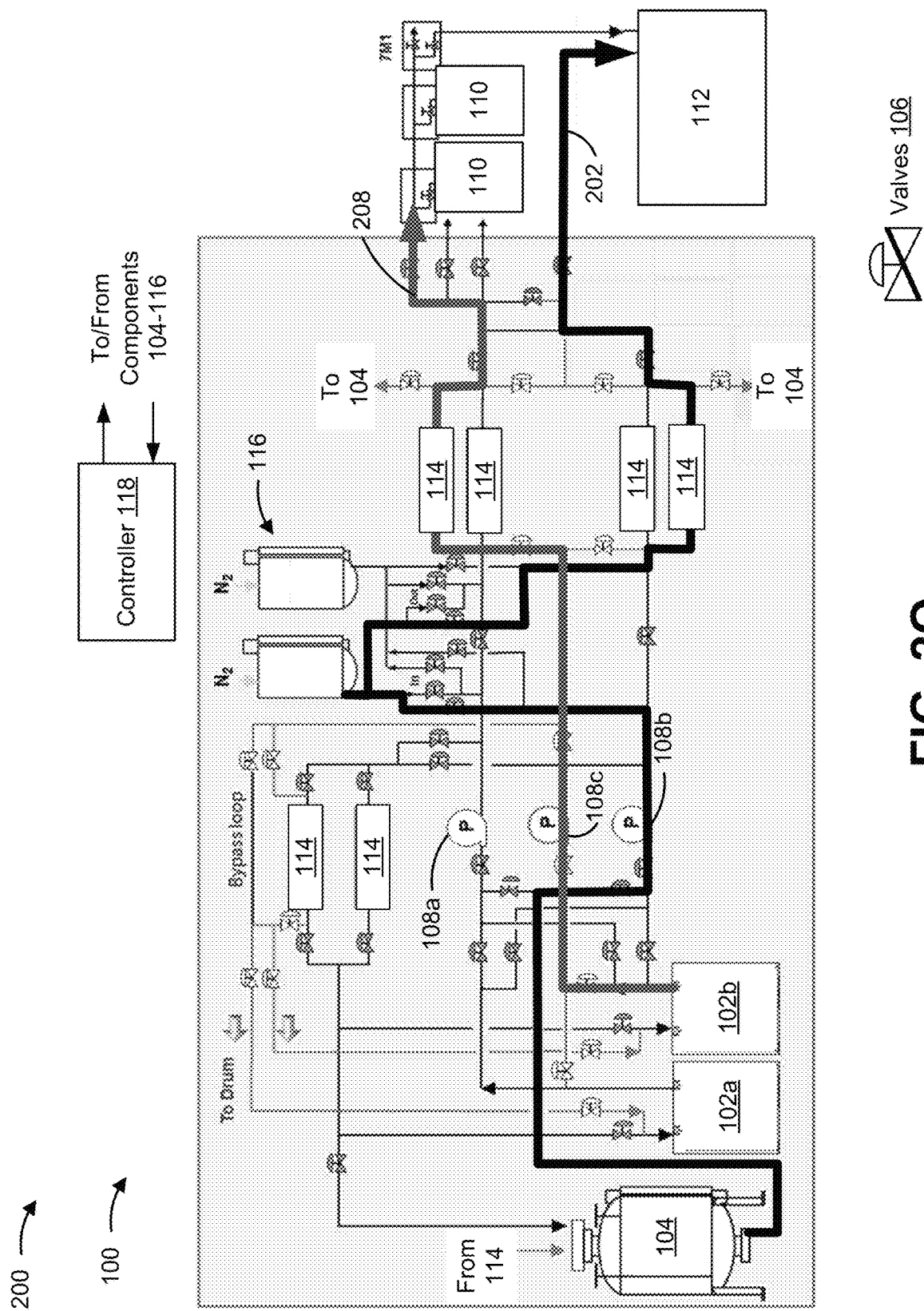
Figure 2R:
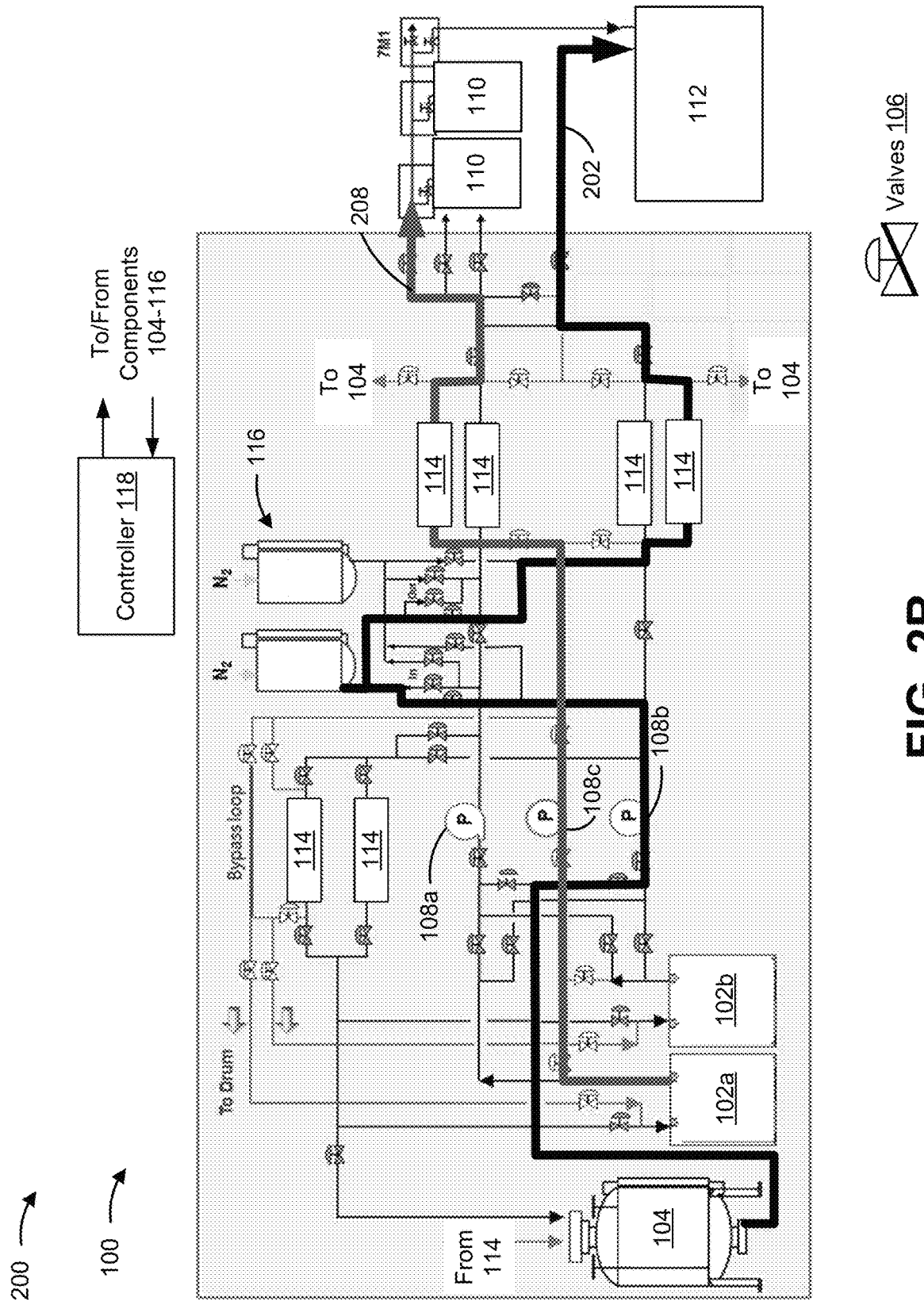

FIGS. 2A-2R are diagrams of example implementations 200 described herein. As shown in FIGS. 2A-2R, example implementations 200 may include a chemical dispensing system, such as chemical dispensing system 100 illustrated and described above in connection with FIGS. 1A and 1B.

As shown in FIG. 2A, chemical dispensing system 100 may operate in a production supply configuration, in which one or more components of chemical dispensing system 100 form a chemical supply line 202 that is configured to provide a semiconductor processing chemical from day tank 104 at least to production POU manifold(s) 110. Chemical supply line 202 may be composed of various components included in chemical dispensing system 100, such as one or more valves 106, one or more filters 114, one or more pressure tanks 116, one or more pipes, one or more fittings, and/or one or more other types of plumbing fixtures. In the production supply configuration, one or more valves 106, one or more pumps 108 (e.g., pump 108a, pump 108b, and/or the like), one or more filters 114, one or more pressure tanks 116, one or more pipes, one or more fittings, and/or one or more other plumbing fixtures included in chemical dispensing system 100 may be opened, closed, connected, and/or otherwise configured such that the semiconductor processing chemical in day tank 104 is directed along a flow path of chemical supply line 202 to production POU manifold(s) 110 and, in some cases, chemical test POU manifold 112.

As shown in FIG. 2B, and by reference number 204, controller 118 may determine that a test is to be performed. In some implementations, controller 118 may determine to perform a maintenance component test or another type of test that is performed to check the performance of chemical dispensing system 100 after a new component is added to chemical dispensing system 100, after a component in chemical dispensing system 100 is replaced, after a chemical dispensing system 100 is repaired, and/or the like. In these cases, semiconductor processing chemical stored in day tank 104 and/or semiconductor processing chemical stored in a storage drum 102 may be provided to chemical test POU manifold 112 for sampling and testing as part of the test. In some aspects, controller 118 may determine to perform a semiconductor processing chemical test based on a new batch of semiconductor processing chemical being added to a storage drum 102. In these cases, the semiconductor processing chemical in the storage drum 102 may be provided to chemical test POU manifold 112 for sampling and testing.

In some implementations, controller 118 may determine that a test is to be performed based on receiving an instruction to perform the test. In some implementations, the instruction may include an input from a user via an input device such as a mouse, a keyboard, a touch screen, a microphone to capture a voice command, and/or the like. In some implementations, the instruction may include an instruction received as input from another component included in chemical dispensing system 100 (e.g., another controller 118 and/or the like). In some implementations, the instruction may include an instruction received as input from a component that is remote from chemical dispensing system 100, such as a remote computer, a cloud computing environment, and/or the like.

As further shown in FIG. 2B, and by reference number 206, controller 118 may cause chemical dispensing system 100 to be transitioned from the production supply configuration to an independent production and test configuration. In some implementations, controller 118 causes chemical dispensing system 100 to be transitioned from the production supply configuration to an independent production and test configuration based on determining to perform a test (e.g., a test of chemical dispensing system 100, a maintenance component test, a semiconductor processing chemical test, and/or the like). Controller 118 may cause chemical dispensing system 100 to be transitioned from the production supply configuration to an independent production and test configuration by automatically closing one or more valves 106, opening one or more valves 106, activating one or more pumps 108, deactivating one or more pumps 108, reconfiguring and/or rearranging one or more filters 114 (e.g., one or more filters 114 that provide a final stage filtration, a one-pass filtration stage, POU filtration, and/or the like), reconfiguring and/or rearranging one or more pipes, fittings, and/or other plumbing fixtures, and/or the like.

Semiconductor processing chemical may be supplied or provided to chemical test POU manifold 112 so that a test of the semiconductor processing chemical may be performed to generate wafer test data. The wafer test data may include information identifying one or more parameters for the semiconductor processing chemical. The one or more parameters may be indicators of the performance of the semiconductor processing chemical, may be indicators of the quality level of the semiconductor processing chemical, and/or the like. For example, the one or more parameters may indicate a purity of the semiconductor processing chemical, may indicate a level of impurities included in the semiconductor processing chemical, may indicate a coverage performance (e.g., a spin coating coverage performance), may indicate one or more measurements of a wafer (e.g., a feature size measurement, a structure measurement, and/or the like), may indicate an etch rate, and/or may indicate one or more other indicators of performance and/or quality of the semiconductor processing chemical. In some implementations, controller 118 may determine whether the one or more parameters for the semiconductor processing chemical satisfy one or more associated thresholds (e.g., a purity threshold, a level of impurities threshold, one or more performance thresholds, and/or the like) and may selectively cause another test to be performed based on a result of the determination. Moreover, if controller 118 determines that a parameter for the semiconductor processing chemical does not satisfy a threshold, controller 118 may cause the semiconductor processing chemical to be filtered for one or more cycles prior to performing the other test.

FIGS. 2C-2R illustrate various example independent production and testing configurations for chemical dispensing system 100. As shown in FIGS. 2C-2R, in an independent production and testing configuration, chemical dispensing system 100 may be configured such that chemical supply line 202 and another chemical supply line 208 are configured to simultaneously and independently provide and/or supply a semiconductor processing chemical to production POU manifold(s) 110 and chemical test POU manifold 112. Chemical supply line 202 and another chemical supply line 208 may independently provide and/or supply a semiconductor processing chemical in that chemical supply line 202 and chemical supply line 208 supply the semiconductor processing chemical from independent sources and using different valves 106, different pumps 108, different filters 114, and/or different pipes such that chemical supply line 202 and chemical supply line 208 supply the semiconductor processing chemical using different flow paths through chemical dispensing system 100.

In particular, chemical supply line 202 is configured to provide and/or supply a semiconductor processing chemical from day tank 104, and chemical supply line 208 is configured to provide and/or supply a semiconductor processing chemical from a storage drum 102 (e.g., storage drum 102a, storage drum 102b, and/or the like). Moreover, chemical supply line 202 is configured to provide and/or supply a semiconductor processing chemical from day tank 104 through the use of pump 108a or pump 108b, whereas chemical supply line 208 is configured to provide and/or supply a semiconductor processing chemical from a storage drum 102 through the use of pump 108c. In these cases, pump 108a or pump 108b may pump and/or otherwise cause the semiconductor processing chemical in day tank 104 to traverse along the flow path of chemical supply line 202, and pump 108c may pump and/or otherwise cause the semiconductor processing chemical in the storage drum 102 to traverse along the flow path of chemical supply line 208. In this way, chemical supply line 202 may supply the semiconductor processing chemical in day tank 104 in a manner in which the use of the semiconductor processing chemical in day tank 104 does not impact or affect the use and supply of the semiconductor processing chemical in the storage drum 102. Similarly, chemical supply line 208 may supply the semiconductor processing chemical in the storage drum 102 in a manner in which the use of the semiconductor processing chemical in the storage drum 102 does not impact or affect the use and supply of the semiconductor processing chemical in day tank 104.

As further shown in FIGS. 2C-2R, in an independent production and testing configuration, chemical supply line 202 and chemical supply line 208 may be configured to supply semiconductor processing chemical to different POU manifolds. For example, chemical supply line 202 may be configured to provide semiconductor processing chemical from day tank 104 to one or more production POU manifolds 110, whereas chemical supply line 208 may be configured to provide semiconductor processing chemical from a storage drum 102 to chemical test POU manifold 112. As another example, chemical supply line 202 may be configured to provide semiconductor processing chemical from day tank 104 to chemical test POU manifold 112, whereas chemical supply line 208 may be configured to provide semiconductor processing chemical from a storage drum 102 to one or more production POU manifolds 110.

As shown in FIG. 2C, an example independent production and testing configuration may include chemical supply line 202 being configured to provide a semiconductor processing chemical from day tank 104 to one or more production POU manifolds 110 through one or more valves 106, pump 108a, a pressure tank 116, a filter 114, one or more pipes, fittings, and/or other plumbing fixtures, and/or the like. Moreover, in the example independent production and testing configuration illustrated in FIG. 2C, chemical supply line 208 may be configured to provide a semiconductor processing chemical from storage drum 102b to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2D, an example independent production and testing configuration may include chemical supply line 202 being configured to provide a semiconductor processing chemical from day tank 104 to one or more production POU manifolds 110 through one or more valves 106, pump 108a, a pressure tank 116, a filter 114, one or more pipes, fittings, and/or other plumbing fixtures, and/or the like. Moreover, in the example independent production and testing configuration illustrated in FIG. 2D, chemical supply line 208 may be configured to provide a semiconductor processing chemical from storage drum 102a to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2E, an example independent production and testing configuration may include chemical supply line 202 being configured to provide a semiconductor processing chemical from day tank 104 to one or more production POU manifolds 110 through one or more valves 106, pump 108b, a pressure tank 116, a filter 114, one or more pipes, fittings, and/or other plumbing fixtures, and/or the like. Moreover, in the example independent production and testing configuration illustrated in FIG. 2E, chemical supply line 208 may be configured to provide a semiconductor processing chemical from storage drum 102b to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2F, an example independent production and testing configuration may include chemical supply line 202 being configured to provide a semiconductor processing chemical from day tank 104 to one or more production POU manifolds 110 through one or more valves 106, pump 108b, a pressure tank 116, a filter 114, one or more pipes, fittings, and/or other plumbing fixtures, and/or the like. Moreover, in the example independent production and testing configuration illustrated in FIG. 2F, chemical supply line 208 may be configured to provide a semiconductor processing chemical from storage drum 102a to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2G, an example independent production and testing configuration may include chemical supply line 202 being configured to provide a semiconductor processing chemical from day tank 104 to one or more production POU manifolds 110 through one or more valves 106, pump 108a, a pressure tank 116, a filter 114, one or more pipes, fittings, and/or other plumbing fixtures, and/or the like. Moreover, in the example independent production and testing configuration illustrated in FIG. 2G, chemical supply line 208 may be configured to provide a semiconductor processing chemical from storage drum 102b to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2H, an example independent production and testing configuration may include chemical supply line 202 being configured to provide a semiconductor processing chemical from day tank 104 to one or more production POU manifolds 110 through one or more valves 106, pump 108a, a pressure tank 116, a filter 114, one or more pipes, fittings, and/or other plumbing fixtures, and/or the like. Moreover, in the example independent production and testing configuration illustrated in FIG. 2H, chemical supply line 208 may be configured to provide a semiconductor processing chemical from storage drum 102a to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2I, an example independent production and testing configuration may include chemical supply line 202 being configured to provide a semiconductor processing chemical from day tank 104 to one or more production POU manifolds 110 through one or more valves 106, pump 108b, a pressure tank 116, a filter 114, one or more pipes, fittings, and/or other plumbing fixtures, and/or the like. Moreover, in the example independent production and testing configuration illustrated in FIG. 2I, chemical supply line 208 may be configured to provide a semiconductor processing chemical from storage drum 102b to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2J, an example independent production and testing configuration may include chemical supply line 202 being configured to provide a semiconductor processing chemical from day tank 104 to one or more production POU manifolds 110 through one or more valves 106, pump 108b, a pressure tank 116, a filter 114, one or more pipes, fittings, and/or other plumbing fixtures, and/or the like. Moreover, in the example independent production and testing configuration illustrated in FIG. 2J, chemical supply line 208 may be configured to provide a semiconductor processing chemical from storage drum 102a to chemical test POU manifold 112 through a flow path, independent from the flow path of chemical supply line 202, that includes one or more valves 106, pump 108c, a filter 114, one or more pipes, fittings, and/or other plumbing fixtures, and/or the like.

As shown in FIG. 2K, an example independent production and testing configuration may include chemical supply line 202 being configured to provide a semiconductor processing chemical from day tank 104 to chemical test POU manifold 112 through one or more valves 106, pump 108a, a pressure tank 116, a filter 114, one or more pipes, fittings, and/or other plumbing fixtures, and/or the like. Moreover, in the example independent production and testing configuration illustrated in FIG. 2K, chemical supply line 208 may be configured to provide a semiconductor processing chemical from storage drum 102b to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2L, an example independent production and testing configuration may include chemical supply line 202 being configured to provide a semiconductor processing chemical from day tank 104 to chemical test POU manifold 112 through one or more valves 106, pump 108a, a pressure tank 116, a filter 114, one or more pipes, fittings, and/or other plumbing fixtures, and/or the like. Moreover, in the example independent production and testing configuration illustrated in FIG. 2L, chemical supply line 208 may be configured to provide a semiconductor processing chemical from storage drum 102a to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2M, an example independent production and testing configuration may include chemical supply line 202 being configured to provide a semiconductor processing chemical from day tank 104 to chemical test POU manifold 112 through one or more valves 106, pump 108b, a pressure tank 116, a filter 114, one or more pipes, fittings, and/or other plumbing fixtures, and/or the like. Moreover, in the example independent production and testing configuration illustrated in FIG. 2M, chemical supply line 208 may be configured to provide a semiconductor processing chemical from storage drum 102b to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2N, an example independent production and testing configuration may include chemical supply line 202 being configured to provide a semiconductor processing chemical from day tank 104 to chemical test POU manifold 112 through one or more valves 106, pump 108b, a pressure tank 116, a filter 114, one or more pipes, fittings, and/or other plumbing fixtures, and/or the like. Moreover, in the example independent production and testing configuration illustrated in FIG. 2N, chemical supply line 208 may be configured to provide a semiconductor processing chemical from storage drum 102a to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2O, an example independent production and testing configuration may include chemical supply line 202 being configured to provide a semiconductor processing chemical from day tank 104 to chemical test POU manifold 112 through one or more valves 106, pump 108a, a pressure tank 116, a filter 114, one or more pipes, fittings, and/or other plumbing fixtures, and/or the like. Moreover, in the example independent production and testing configuration illustrated in FIG. 2O, chemical supply line 208 may be configured to provide a semiconductor processing chemical from storage drum 102b to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2P, an example independent production and testing configuration may include chemical supply line 202 being configured to provide a semiconductor processing chemical from day tank 104 to chemical test POU manifold 112 through one or more valves 106, pump 108a, a pressure tank 116, a filter 114, one or more pipes, fittings, and/or other plumbing fixtures, and/or the like. Moreover, in the example independent production and testing configuration illustrated in FIG. 2P, chemical supply line 208 may be configured to provide a semiconductor processing chemical from storage drum 102a to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2Q, an example independent production and testing configuration may include chemical supply line 202 being configured to provide a semiconductor processing chemical from day tank 104 to chemical test POU manifold 112 through one or more valves 106, pump 108b, a pressure tank 116, a filter 114, one or more pipes, fittings, and/or other plumbing fixtures, and/or the like. Moreover, in the example independent production and testing configuration illustrated in FIG. 2Q, chemical supply line 208 may be configured to provide a semiconductor processing chemical from storage drum 102b to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As shown in FIG. 2R, an example independent production and testing configuration may include chemical supply line 202 being configured to provide a semiconductor processing chemical from day tank 104 to chemical test POU manifold 112 through one or more valves 106, pump 108b, a pressure tank 116, a filter 114, one or more pipes, fittings, and/or other plumbing fixtures, and/or the like. Moreover, in the example independent production and testing configuration illustrated in FIG. 2R, chemical supply line 208 may be configured to provide a semiconductor processing chemical from storage drum 102a to one or more production POU manifolds 110 through a flow path, independent from the flow path of chemical supply line 202, that includes one or more valves 106, pump 108c, a filter 114, one or more pipes, fittings, and/or other plumbing fixtures, and/or the like.

As indicated above, FIGS. 2A-2R are provided as examples. Other examples may differ from what is described with regard to FIGS. 2A-2R.

Figure 3A:
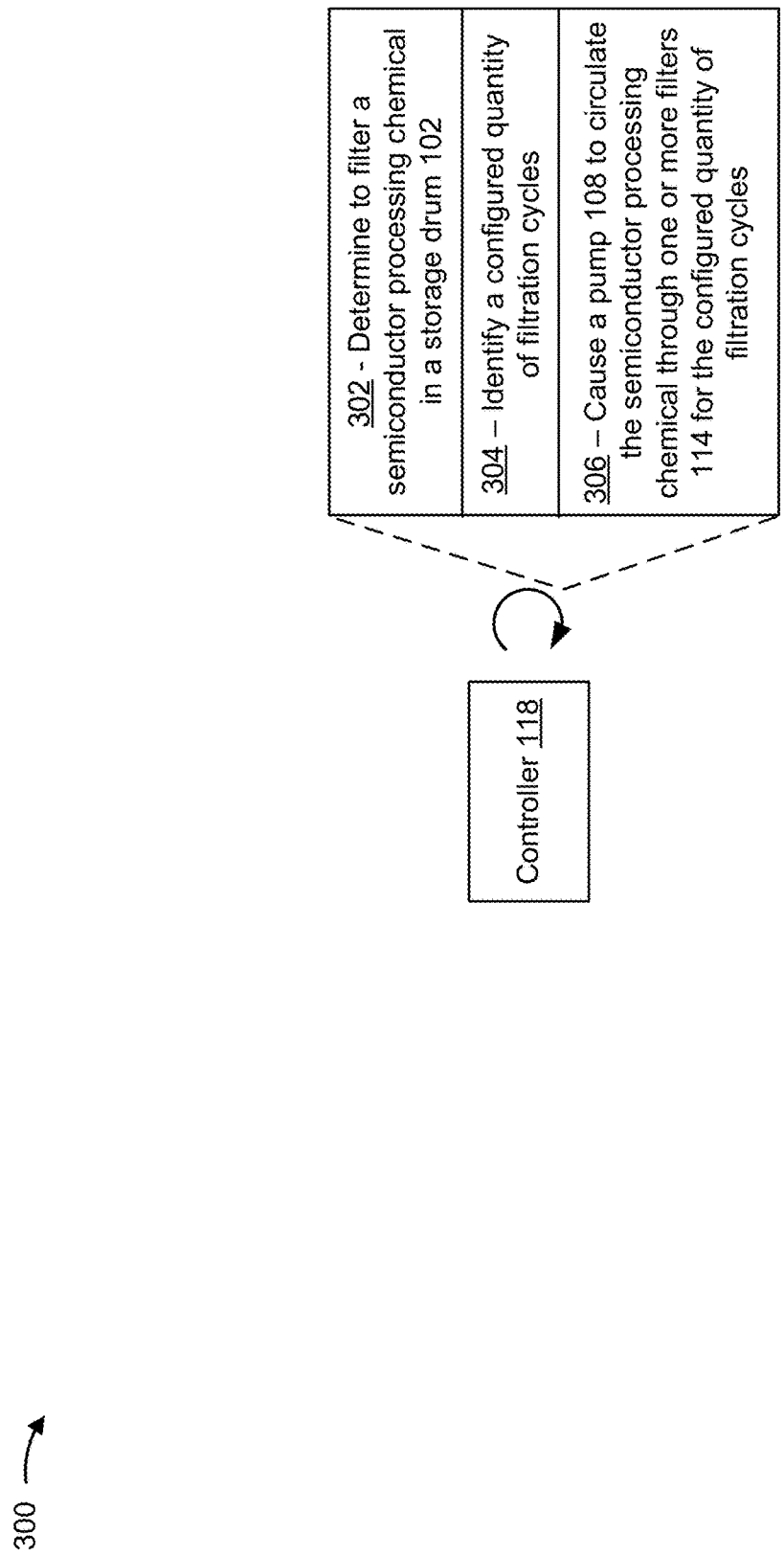
FIGS. 3A and 3B are diagrams of one or more example implementations described herein.
Figure 3B:
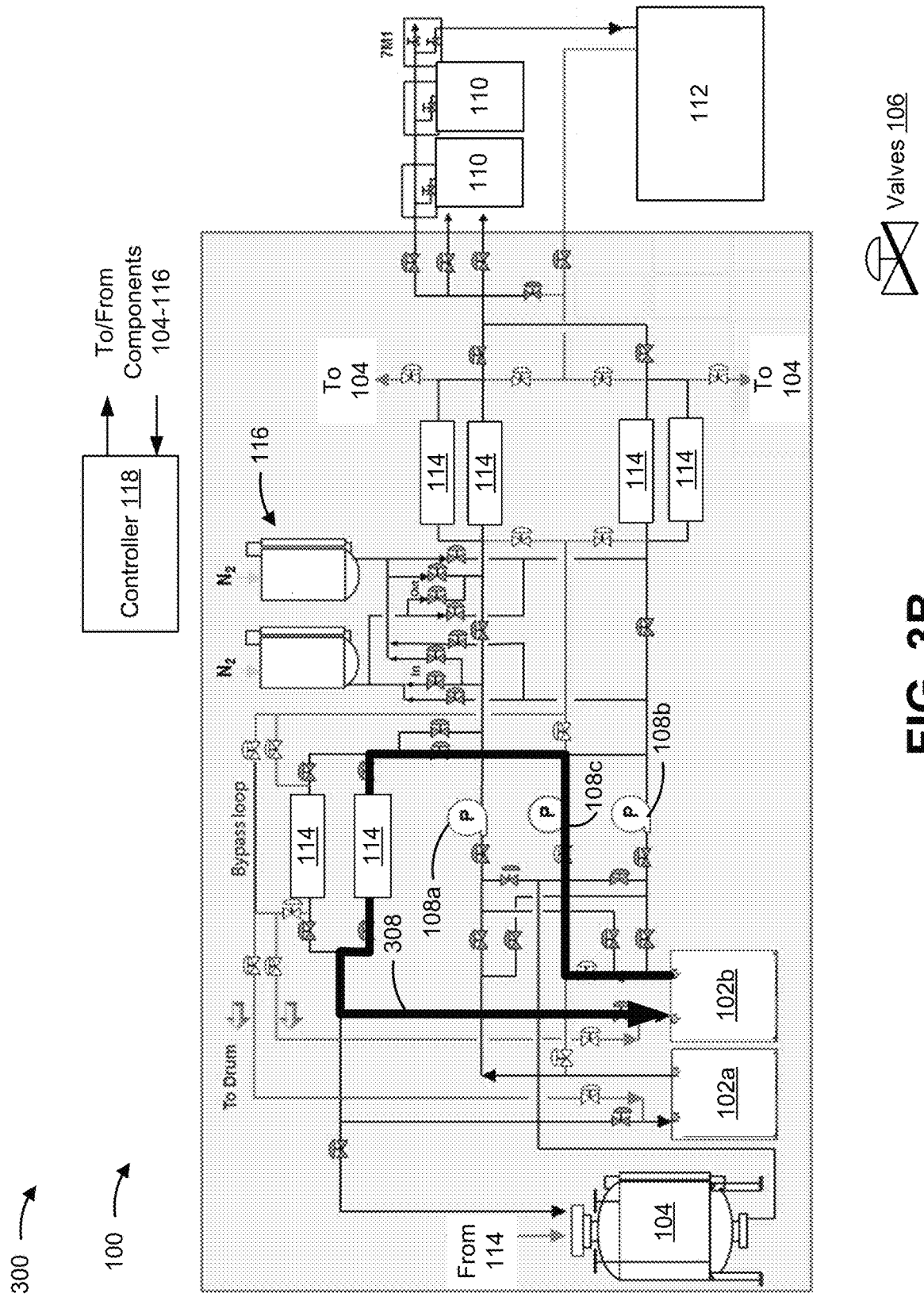

FIGS. 3A and 3B are diagrams of one or more example implementations 300 described herein. As shown in FIGS. 3A and 3B, example implementation(s) 300 may include a chemical dispensing system, such as chemical dispensing system 100 illustrated and described above in connection with FIGS. 1A and 1B.

As shown in FIG. 3A, and by reference number 302, controller 118 may determine to filter a semiconductor processing chemical in a storage drum 102. In some implementations, controller 118 may determine to filter the semiconductor processing chemical based on determining that a new batch of semiconductor processing chemical has been added to the storage drum 102, based on determining that the storage drum 102 is in a standby mode (e.g., a mode in which the storage drum 102 is not supplying semiconductor processing chemical to a production POU manifold 110 or a chemical test POU manifold 112), and/or the like. In some implementations, controller 118 may determine to filter the semiconductor processing chemical based on receiving an instruction to filter the semiconductor processing chemical in the storage drum 102. In some implementations, the instruction may include an input from a user via an input device such as a mouse, a keyboard, a touch screen, a microphone to capture a voice command, and/or the like. In some implementations, the instruction may include an instruction received as input from another component included in chemical dispensing system 100 (e.g., another controller 118 and/or the like). In some implementations, the instruction may include an instruction received as input from a component that is remote from chemical dispensing system 100, such as a remote computer, a cloud computing environment, and/or the like.

As further shown in FIG. 3A, and by reference number 304, controller 118 may identify a configured quantity of filtration cycles for filtering the semiconductor processing chemical in the storage drum 102. The configured quantity of filtration cycles may be a set and/or configured quantity of times that new batches of semiconductor processing chemical are filtered through a filtration loop (e.g., 3 times through the filtration loop, 5 times through the filtration loop, and/or the like) after being added to the storage drum 102 and/or prior to being used to supply semiconductor processing chemical to day tank 104. The configured quantity of filtration cycles is used to filter each new batch of semiconductor processing chemical the same quantity of filtration cycles, thereby ensuring a similar level of filtration and a similar level of quality control across batches of semiconductor processing chemical.

Controller 118 may identify the configured quantity of filtration cycles based on information identifying the configured quantity of filtration cycles. In some implementations, the information identifying the configured quantity of filtration cycles is included in a data structure of controller 118, such as a memory component, a storage component, an electronic database, an electronic table, an electronic file or file system, and/or the like. In some implementations, the information identifying the configured quantity of filtration cycles is included in a data structure of another device or system, such as a server, a cloud environment, and/or the like.

As further shown in FIG. 3A, and by reference number 306, controller 118 may cause a pump 108 to circulate the semiconductor processing chemical through a filtration loop that includes one or more filters 114. Controller 118 may cause the pump 108 to circulate the semiconductor processing chemical through the filtration loop for the configured quantity of filtration cycles. In some implementations, controller 118 may determine that a filtration cycle is complete based on the storage capacity of the storage drum 102, the volume of semiconductor processing chemical stored in the storage drum 102, the filtration rate of the filtration loop, and/or the like. For example, controller 118 may determine that the storage drum 102 stores 200 liters of semiconductor processing chemical and that the filtration loop is capable of processing 20 liters per minute. Accordingly, controller 118 may determine that each filtration cycle is 10 minutes.

FIG. 3B illustrates an example implementation of a filtration loop 308 for filtering a semiconductor processing chemical directly from a storage drum 102. As shown in FIG. 3B, filtration loop 308 may include one or more valves 106, pump 108c, one or more pipes, one or more fittings, and/or one or more other types of plumbing fixtures, and/or the like that are configured to circulate the semiconductor processing chemical in the storage drum 102 through a filter 114 and back into the storage drum 102 (e.g., storage drum 102b).

In some implementations, chemical dispensing system 100 is capable of independently supplying semiconductor processing chemical in day tank 104 simultaneously with filtering the semiconductor processing chemical in the storage drum 102 through filtration loop 308. For example, controller 118 may configure independent chemical supply lines in chemical dispensing system 100 such that chemical supply line 202 provides the semiconductor processing chemical from day tank 104 to one or more production POU manifolds 110 for production use or to chemical test POU manifold 112 for test in parallel with chemical supply line 208 cycling the semiconductor processing chemical in the storage drum 102 through filtration loop 308. In these cases, pump 108a or pump 108b may pump the semiconductor processing chemical from day tank 104 through a configured set of one or more pipes, one or more fittings, and/or one or more other types of plumbing fixtures that is independent from the set of one or more pipes, one or more fittings, and/or one or more other types of plumbing fixtures through which pump 108c pumps the semiconductor processing chemical in the storage drum 102 through filtration loop 308.

As indicated above, FIGS. 3A and 3B are provided as one or more examples. Other examples may differ from what is described with regard to FIGS. 3A and 3B.

Figure 4:
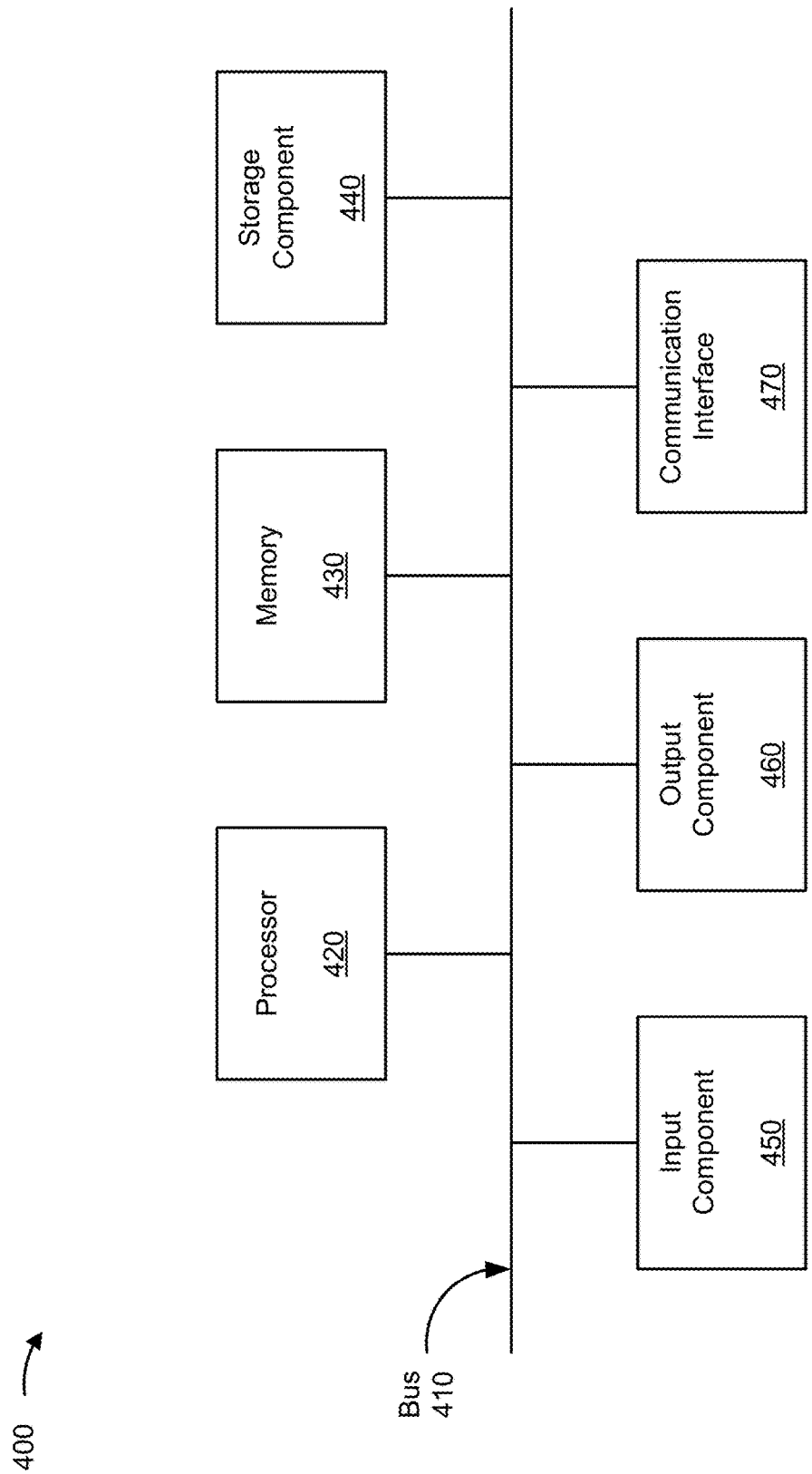
FIG. 4 is a diagram of example components of one or more devices of FIGS. 1A, 1B, 2A-2R, 3A, and 3B.

FIG. 4 is a diagram of example components of a device 400. Device 400 may correspond to controller 118. In some implementations, controller 118 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
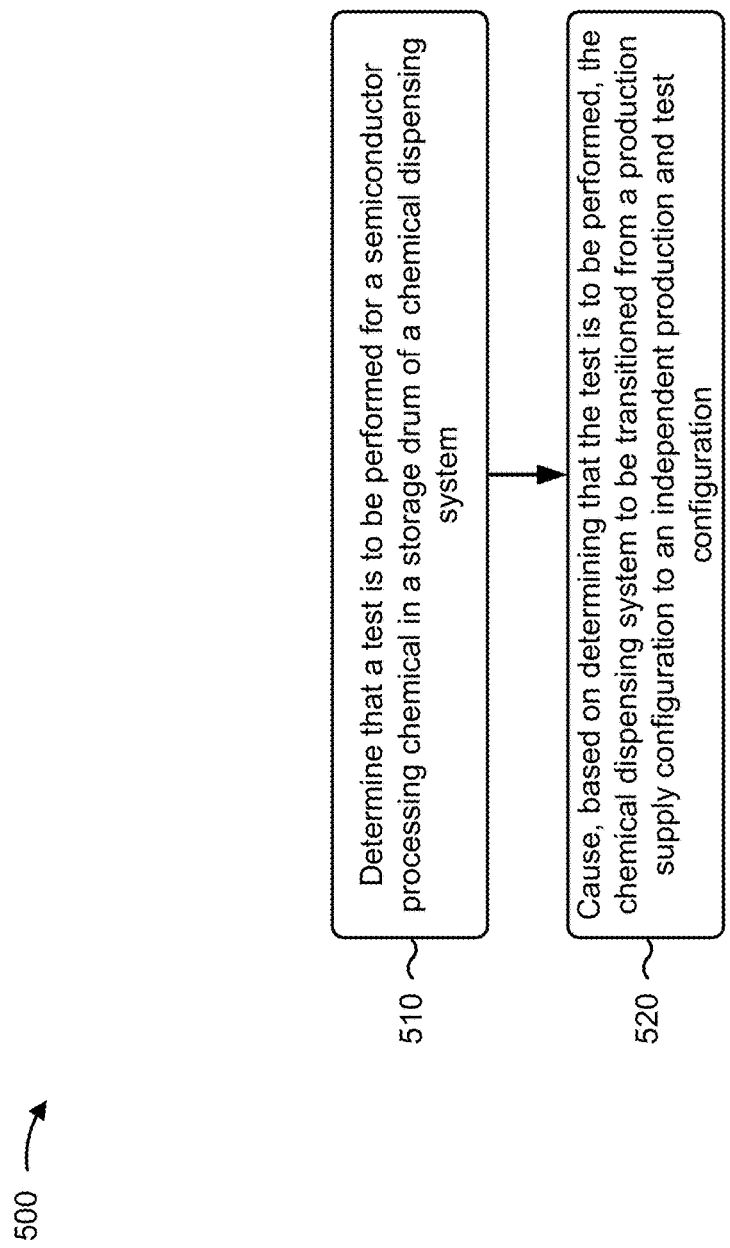
FIG. 5 is a flowchart of an example process for dispensing a semiconductor processing chemical.

FIG. 5 is a flow chart of an example process 500 for dispensing a semiconductor processing chemical. In some implementations, one or more process blocks of FIG. 5 may be performed by a controller (e.g., controller 180, device 400, and/or the like). In some implementations, one or more process blocks of FIG. 5 may be performed by another device or a group of devices separate from or including the controller, such as another component of a chemical dispensing system (e.g., chemical dispensing system 100) and/or the like.

As shown in FIG. 5, process 500 may include determining that a test is to be performed for a semiconductor processing chemical in a storage drum of a chemical dispensing system (block 510). For example, the controller (e.g., using processor 420, memory 430, storage component 440, input component 450, output component 460, communication interface 470, and/or the like) may determine that a test is to be performed for a semiconductor processing chemical in a storage drum (e.g., storage drum 102) of a chemical dispensing system (e.g., chemical dispensing system 100), as described above.

As further shown in FIG. 5, process 500 may include causing, based on determining that the test is to be performed, the chemical dispensing system to be transitioned from a production supply configuration to an independent production and test configuration, in which a first chemical supply line of the chemical dispensing system is configured to provide a semiconductor processing chemical in a day tank to a POU or a chemical test POU, and a second chemical supply line of the chemical dispensing system is configured to provide the semiconductor processing chemical in the storage drum to the chemical test POU or the production POU based on whether the first chemical supply line is configured to provide the semiconductor processing chemical in the day tank to the production POU or the chemical test POU (block 520). For example, the controller (e.g., using processor 420, memory 430, storage component 440, input component 450, output component 460, communication interface 470, and/or the like) may cause, based on determining that the test is to be performed, the chemical dispensing system to be transitioned from a production supply configuration to an independent production and test configuration, as described above. In some implementations, in the independent production and test configuration, a first chemical supply line (e.g., chemical supply line 202) of the chemical dispensing system is configured to provide a semiconductor processing chemical in a day tank (e.g., day tank 104) to a production POU (e.g., via a production POU manifold 110) or a chemical test POU (e.g., via a chemical test POU manifold 112). In some implementations, in the independent production and test configuration, a second chemical supply line (e.g., chemical supply line 208) of the chemical dispensing system is configured to provide the semiconductor processing chemical in the storage drum to the chemical test POU or the production POU based on whether the first chemical supply line is configured to provide the semiconductor processing chemical in the day tank to the production POU or the chemical test POU.

Process 500 may include additional implementations, such as any single implementation or any combination of implementations described below and/or in connection with one or more other processes described elsewhere herein.

In a first implementation, in the independent production and test configuration, the first chemical supply line is configured to provide the semiconductor processing chemical in the day tank to the production POU, and the second chemical supply line is configured to provide the semiconductor processing chemical in the storage drum to the chemical test POU, and the process 500 includes causing a first pump (e.g., pump 108a, pump 108b, and/or the like) to provide the semiconductor processing chemical in the day tank to the production POU through the first chemical supply line, and causing a second pump (e.g., pump 108c) to provide the semiconductor processing chemical in the storage drum to the chemical test POU through the second chemical supply line. In a second implementation, alone or in combination with the first implementation, determining that the test is to be performed includes determining that the test is to be performed based on determining that a new batch of semiconductor processing chemical was added to the storage drum.

In a third implementation, alone or in combination with one or more of the first and second implementations, determining that the test is to be performed includes determining that the test is to be performed based on receiving an instruction to perform the test. In a fourth implementation, alone or in combination with one or more of the first through third implementations, in the independent production and test configuration, the first chemical supply line is configured to provide the semiconductor processing chemical in the day tank to the chemical test POU, and the second chemical supply line is configured to provide the semiconductor processing chemical in the storage drum to the production POU, and process 500 includes causing a first pump (e.g., pump 108a, pump 108b, and/or the like) to provide the semiconductor processing chemical in the day tank to the chemical test POU through the first chemical supply line, and causing a second pump (e.g., pump 108c) to provide the semiconductor processing chemical in the storage drum to the production POU through the second chemical supply line.

In a fifth implementation, alone or in combination with one or more of the first through fourth implementations, process 500 includes determining to filter the semiconductor processing chemical in the storage drum, identifying a configured quantity of filtration cycles for filtering the semiconductor processing chemical in the storage drum, and causing a pump to circulate the semiconductor processing chemical in the storage drum through a filter (e.g., filter 114)

included in the chemical dispensing system for a quantity of filtration cycles equal to the configured quantity of filtration cycles. In a sixth implementation, alone or in combination with one or more of the first through fifth implementations, process 500 includes determining, based on a test of the semiconductor processing chemical in the storage drum, one or more parameters for the semiconductor processing chemical in the storage drum, determining that the one or more parameters satisfy one or more test thresholds, and causing, based on determining that the one or more parameters for the semiconductor processing chemical in the storage drum satisfies the one or more test thresholds, the chemical dispensing system to be transitioned from the independent production and test configuration to the production supply configuration, in which the first chemical supply line is connected to the day tank, the production POU, and the chemical test POU.

In a seventh implementation, alone or in combination with one or more of the first through sixth implementations, process 500 includes determining, based a first test of the semiconductor processing chemical in the storage drum, one or more parameters for the semiconductor processing chemical in the storage drum, determining that the one or more parameters do not satisfy one or more test thresholds, causing the second supply line to be flushed based on determining that the one or more parameters for the semiconductor processing chemical in the storage drum does not satisfy the one or more test thresholds, and causing a second test to be performed for the semiconductor processing chemical in the storage drum after the second chemical supply line is flushed.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
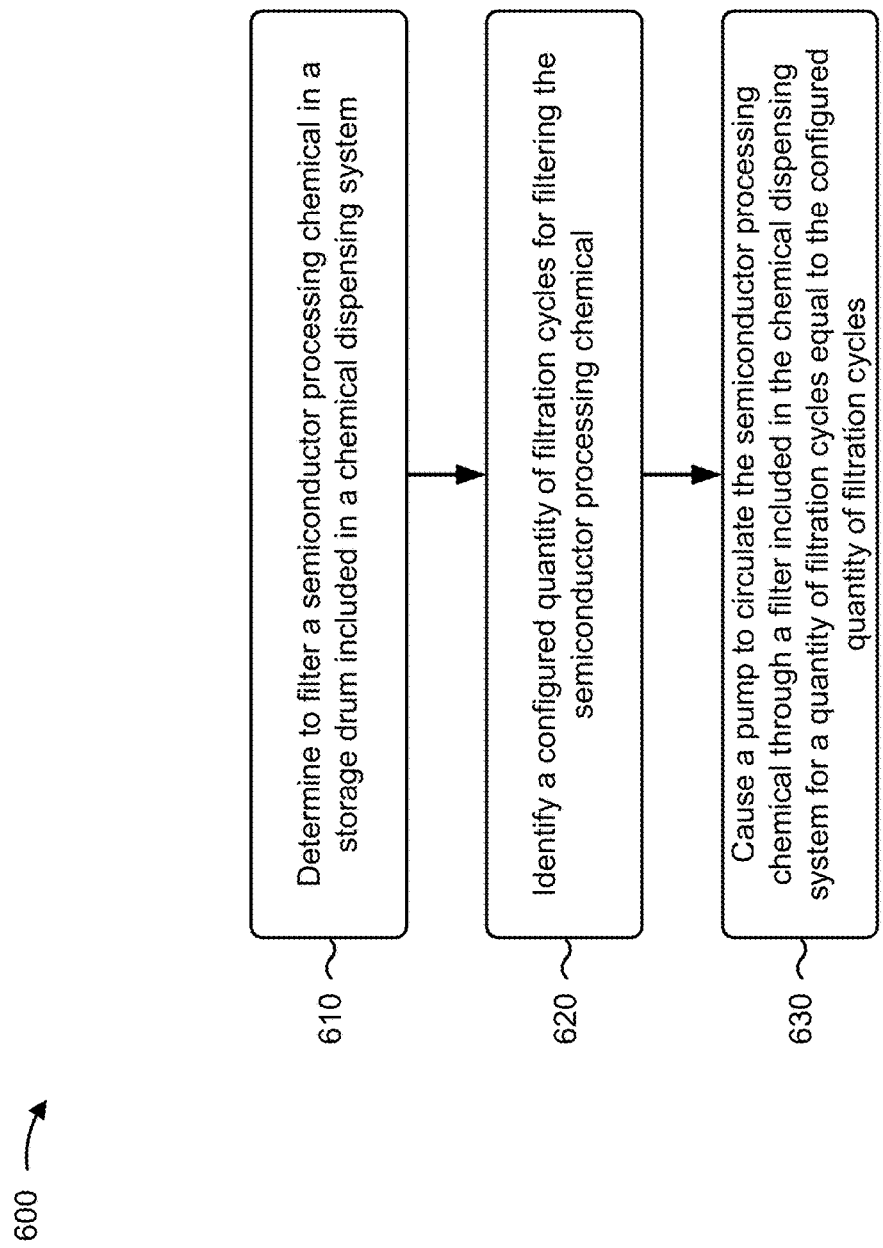
FIG. 6 is a flowchart of an example process for filtering a semiconductor processing chemical.

FIG. 6 is a flow chart of an example process 600 for filtering a semiconductor processing chemical. In some implementations, one or more process blocks of FIG. 6 may be performed by a controller (e.g., controller 180, device 400, and/or the like). In some implementations, one or more process blocks of FIG. 6 may be performed by another device or a group of devices separate from or including the controller, such as another component of a chemical dispensing system (e.g., chemical dispensing system 100) and/or the like.

As shown in FIG. 6, process 600 may include determining to filter a semiconductor processing chemical in a storage drum included in a chemical dispensing system (block 610). For example, the controller (e.g., using processor 420, memory 430, storage component 440, input component 450, output component 460, communication interface 470, and/or the like) may determine to filter a semiconductor processing chemical in a storage drum (e.g., storage drum 102) included in a chemical dispensing system (e.g., chemical dispensing system 100), as described above.

As further shown in FIG. 6, process 600 may include identifying a configured quantity of filtration cycles for filtering the semiconductor processing chemical (block 620). For example, the controller (e.g., using processor 420, memory 430, storage component 440, input component 450, output component 460, communication interface 470, and/or the like) may identify a configured quantity of filtration cycles for filtering the semiconductor processing chemical, as described above.

As further shown in FIG. 6, process 600 may include causing a pump to circulate the semiconductor processing chemical through a filter included in the chemical dispensing system for a quantity of filtration cycles equal to the configured quantity of filtration cycles (block 630). For example, the controller (e.g., using processor 420, memory 430, storage component 440, input component 450, output component 460, communication interface 470, and/or the like) may cause a pump (e.g., pump 108c) to circulate the semiconductor processing chemical through a filter (e.g., filter 114) included in the chemical dispensing system for a quantity of filtration cycles equal to the configured quantity of filtration cycles, as described above.

Process 600 may include additional implementations, such as any single implementation or any combination of implementations described below and/or in connection with one or more other processes described elsewhere herein.

In a first implementation, process 600 includes causing the pump to circulate the semiconductor processing chemical through a first supply line (e.g., chemical supply line 208) that is independent from a second supply line (e.g., chemical supply line 202) that is used to provide a semiconductor processing chemical in a day tank (e.g., day tank 104) to a production POU (e.g., via a production POU manifold 110). In a second implementation, alone or in combination with the first implementation, process 600 includes causing another pump (e.g., pump 108a, pump 108b, and/or the like) to provide the semiconductor processing chemical in the day tank to the production POU through the second supply line. In a third implementation, alone or in combination with one or more of the first and second implementations, process 600 includes determining that the storage drum is in a standby mode; and determining to filter the semiconductor processing chemical based on determining that the storage drum is in the standby mode.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
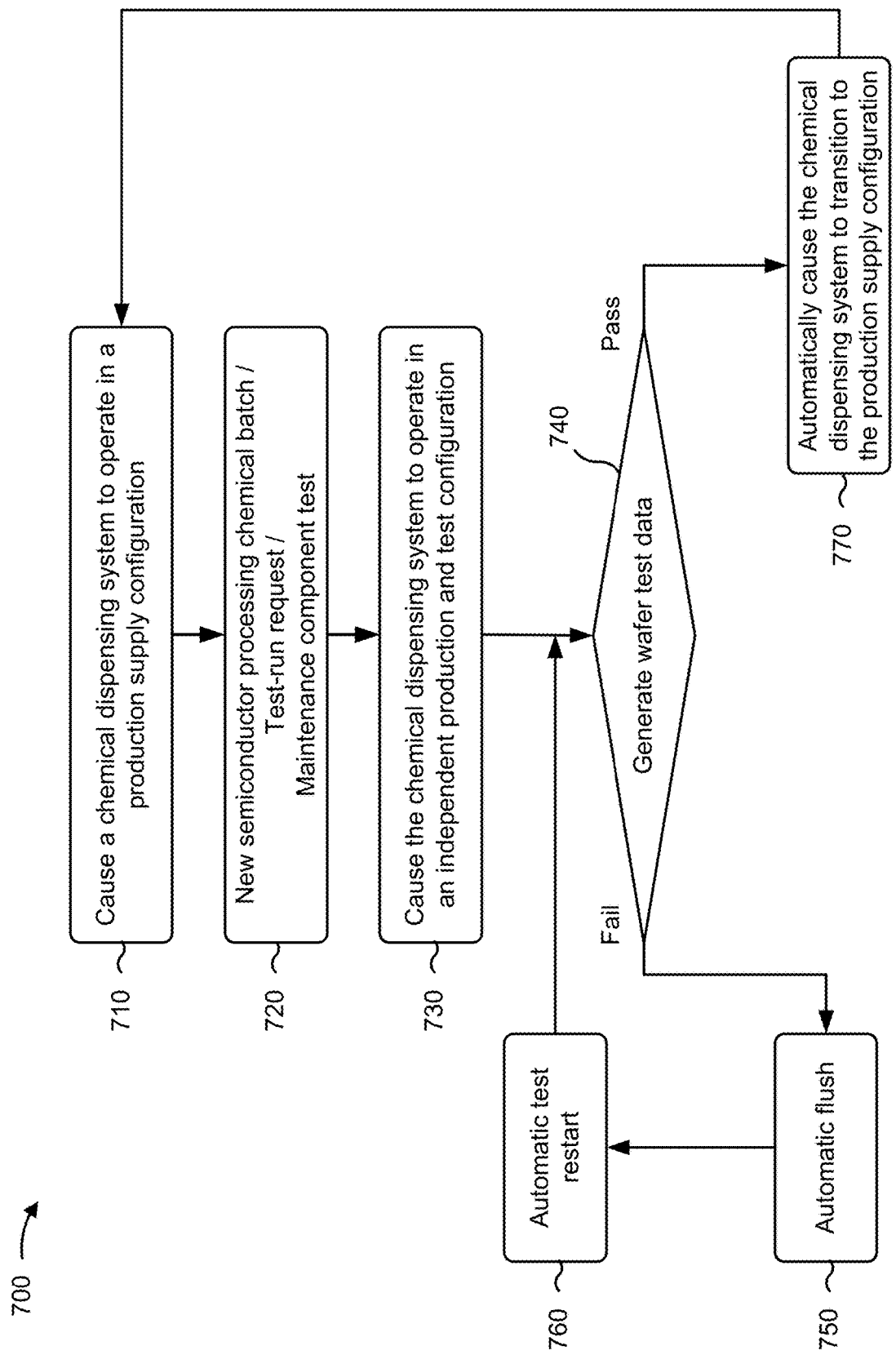
FIG. 7 is a flowchart of an example process for dispensing a semiconductor processing chemical.

FIG. 7 is a flowchart of an example process 700 for dispensing a semiconductor processing chemical. In some implementations, one or more process blocks of FIG. 7 may be performed by a controller (e.g., controller 180, device 400, and/or the like). In some implementations, one or more process blocks of FIG. 7 may be performed by another device or a group of devices separate from or including the controller, such as another component in a chemical dispensing system (e.g., chemical dispensing system 100) and/or the like.

As shown in FIG. 7, process 700 may include causing a chemical supply system to operate in a production supply configuration (block 710). For example, the controller (e.g., using processor 420, memory 430, storage component 440, input component 450, output component 460, communication interface 470, and/or the like) may cause a chemical dispensing system (e.g., chemical dispensing system 100) to operate in a production supply configuration, as described above. In some implementations, in the production supply configuration, a first chemical supply line (e.g., chemical supply line 202) is connected to a day tank (e.g., day tank 104) of the chemical dispensing system, one or more production POU manifolds (e.g., production POU manifold(s) 110), and a chemical test POU manifold (e.g., chemical test POU manifold 112).

As further shown in FIG. 7, process 700 may include determining to perform a test based on a new semiconductor processing chemical batch being added to a storage drum of the chemical dispensing system, based on a test-run request, based on a maintenance component test for a component added to or replaced in the chemical dispensing system, and/or the like (block 720). For example, the controller (e.g., using processor 420, memory 430, storage component 440, input component 450, output component 460, communication interface 470, and/or the like) may determine to perform a test based on a new semiconductor processing chemical batch being added to a storage drum (e.g., storage drum 102) of the chemical dispensing system, based on a test-run request, based on a maintenance component test for a component (e.g., a replacement pump 108, a replacement valve 106, and/or the like) added to or replaced in the chemical dispensing system, and/or the like, as described above. In some implementations, the test may include supplying a semiconductor processing chemical to the chemical test POU manifold so that wafer test data may be generated based on the semiconductor processing chemical.

As further shown in FIG. 7, process 700 may include causing the chemical supply system to operate in an independent production and test configuration (block 730). For example, the controller (e.g., using processor 420, memory 430, storage component 440, input component 450, output component 460, communication interface 470, and/or the like) may cause the chemical supply system to operate in an independent production and test configuration, as described above. In some implementations, in the independent production and test configuration, the first chemical supply line (e.g., chemical supply line 202) of the chemical dispensing system is configured to provide the semiconductor processing chemical in the day tank to the production POU manifold or the chemical test POU manifold, and a second chemical supply line (e.g., chemical supply line 208) of the chemical dispensing system is configured to provide a semiconductor processing chemical in a storage drum (e.g., storage drum 102) of the chemical dispensing system to the chemical test POU manifold or the production POU manifold based on whether the first chemical supply line is configured to provide the semiconductor processing chemical in the day tank to the production POU manifold or the chemical test POU manifold.

As further shown in FIG. 7, process 700 may include generating wafer test data (block 740). For example, the controller (e.g., using processor 420, memory 430, storage component 440, input component 450, output component 460, communication interface 470, and/or the like) may generate wafer test data, as described above. In some implementations, the wafer test data may be generated based on performing the test while the chemical dispensing system is operating in the independent production and test configuration. In some implementations, the controller may determine whether the test passed or failed based on the wafer test data.

As further shown in FIG. 7, process 700 may include automatically performing a flush of the chemical supply line that was used to supply the semiconductor processing chemical to the chemical test POU manifold (block 750). For example, the controller (e.g., using processor 420, memory 430, storage component 440, input component 450, output component 460, communication interface 470, and/or the like) may automatically perform a flush of the chemical supply line that was used to supply the semiconductor processing chemical to the chemical test POU manifold, as described above. In some implementations, the flush of the chemical supply line that was used to supply the semiconductor processing chemical to the chemical test POU manifold may be performed based on a determination that the test failed (block 740—Fail).

As further shown in FIG. 7, process 700 may include automatically restarting the test (block 760). For example, the controller (e.g., using processor 420, memory 430, storage component 440, input component 450, output component 460, communication interface 470, and/or the like) may automatically restart the test, as described above. In some implementations, the actions associated with blocks 740-760 may be performed until the controller determines that the test passes. In some implementations, the controller may cause the semiconductor processing chemical to be filtered for one or more filtration cycles based on determining that the test failed.

As further shown in FIG. 7, process 700 may include automatically causing the chemical supply system to transition to the production supply configuration (block 770). For example, the controller (e.g., using processor 420, memory 430, storage component 440, input component 450, output component 460, communication interface 470, and/or the like) may automatically cause the chemical supply system to transition to the production supply configuration, as described above. In some implementations, the controller may automatically cause the chemical supply system to transition to the production supply configuration based on determining that the test passed (block 740—Pass).

Process 700 may include additional implementations, such as any single implementation or any combination of implementations described in connection with one or more other processes described elsewhere herein. Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, chemical dispensing system 100 is capable of simultaneously supplying a semiconductor processing chemical for production and testing through the use of independent chemical supply lines 202 and 208, which reduces production downtime of an associated semiconductor process, increases throughput and capability of the semiconductor process, and/or the like. Moreover, the capability to simultaneously supply the semiconductor processing chemical for production and testing allows for an increased quantity of semiconductor processing chemical batches to be tested with minimal impact to production, which increases quality control over the semiconductor processing chemical. In addition, the independent chemical supply lines 202 and 208 may be used to supply the semiconductor processing chemical to production while independently filtering semiconductor processing chemical directly from a storage drum 102 through a filtration loop 308.

As described in greater detail above, some implementations described herein provide a chemical dispensing system. The chemical dispensing system includes a first chemical supply line configured to provide a semiconductor processing chemical from a day tank to one or more production POU manifolds or a chemical test POU manifold. The chemical dispensing system includes a second chemical supply line configured to provide a semiconductor processing chemical from a storage drum to the chemical test POU manifold or the one or more production POU manifolds based on whether the first chemical supply line is configured to provide the semiconductor processing chemical from the day tank to the one or more POU manifolds or the chemical test POU manifold. A pump used for the first chemical supply line is different from a pump used for the second chemical supply line.

As described in greater detail above, some implementations described herein provide a method. The method includes determining, by one or more processors, that a test is to be performed for a semiconductor processing chemical in a storage drum of a chemical dispensing system. The method includes causing, by the one or more processors and based on determining that the test is to be performed, the chemical dispensing system to be transitioned from a production supply configuration to an independent production and test configuration. In the independent production and test configuration, a first chemical supply line of the chemical dispensing system is configured to provide a semiconductor processing chemical in a day tank to a production POU or a chemical test POU. In the independent production and test configuration, a second chemical supply line of the chemical dispensing system is configured to provide the semiconductor processing chemical in the storage drum to the chemical test POU or the production POU based on whether the first chemical supply line is configured to provide the semiconductor processing chemical in the day tank to the production POU or the chemical test POU.

As described in greater detail above, some implementations described herein provide a device. The device includes one or more memories and one or more processors, communicatively coupled to the one or more memories. The one or more processors are to determine to filter a semiconductor processing chemical in a storage drum included in a chemical dispensing system. The one or more processors are to identify a configured quantity of filtration cycles for filtering the semiconductor processing chemical. The one or more processors are to cause a pump to circulate the semiconductor processing chemical through a filter included in the chemical dispensing system for a quantity of filtration cycles equal to the configured quantity of filtration cycles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical dispensing system, comprising:
    a controller configured to:
        determine, based on determining that a new batch of a semiconductor processing chemical was added to a storage drum of the chemical dispensing system, that a test is to be performed for the semiconductor processing chemical in the storage drum; and
        cause, based on determining that the test is to be performed, the chemical dispensing system to be transitioned from a production supply configuration to an independent production and test configuration;
    a first chemical supply line, in the independent production and test configuration, configured to provide the semiconductor processing chemical in a day tank to a production point of use (POU) or a chemical test POU; and
    a second chemical supply line, in the independent production and test configuration, configured to provide the semiconductor processing chemical in the storage drum to the chemical test POU or the production POU based on whether the first chemical supply line is configured to provide the semiconductor processing chemical in the day tank to the production POU or the chemical test POU.

2. The chemical dispensing system of claim 1, further comprising:
    one or more first pumps configured to pump the semiconductor processing chemical in the day tank to the POU through the first chemical supply line; and
    one or more second pumps configured to pump the semiconductor processing chemical in the storage drum to the chemical test POU through the second chemical supply line.

3. The chemical dispensing system of claim 1,
    wherein the chemical dispensing system further comprises:
        one or more first pumps configured to pump the semiconductor processing chemical from the day tank to the chemical test POU through the first chemical supply line; and
        one or more second pumps configured to pump the semiconductor processing chemical from the storage drum to the production POU through the second chemical supply line.

4. The chemical dispensing system of claim 1, wherein the controller is further configured to:
    determine to filter the semiconductor processing chemical in the storage drum;
    identify a configured quantity of filtration cycles for filtering the semiconductor processing chemical in the storage drum; and
    cause a pump to circulate the semiconductor processing chemical in the storage drum through a filter included in the chemical dispensing system for a quantity of filtration cycles equal to the configured quantity of filtration cycles.

5. The chemical dispensing system of claim 1, further comprising:
    a test POU manifold,
    wherein the test POU manifold comprises:
        a plurality of POU valves configured to provide at least one of the semiconductor processing chemical in the day tank or the semiconductor processing chemical in the storage drum to a plurality of testing POUs.

6. The chemical dispensing system of claim 5, wherein the test POU manifold further comprises:
    a flush drain line configured to drain the semiconductor processing chemical from the test POU manifold; and
    a sampling line configured to provide a portion of the semiconductor processing chemical, drained from the test POU manifold, for quality assurance sampling.

7. The chemical dispensing system of claim 1, further comprising:
    one or more first valves to switch the first chemical supply line between the production POU and the chemical test POU; and
    one or more second valves to switch the second chemical supply line between the production POU and the chemical test POU.

8. A method, comprising:
determining, by one or more processors and based on determining that a new batch of a semiconductor processing chemical was added to a storage drum of a chemical dispensing system, that a test is to be performed for the semiconductor processing chemical in the storage drum; and
causing, by the one or more processors and based on determining that the test is to be performed, the chemical dispensing system to be transitioned from a production supply configuration to an independent production and test configuration,
wherein, in the independent production and test configuration, a first chemical supply line of the chemical dispensing system is configured to provide the semiconductor processing chemical in a day tank to a production point of use (POU) or a chemical test POU, and
wherein, in the independent production and test configuration, a second chemical supply line of the chemical dispensing system is configured to provide the semiconductor processing chemical in the storage drum to the chemical test POU or the production POU based on whether the first chemical supply line is configured to provide the semiconductor processing chemical in the day tank to the production POU or the chemical test POU.

9. The method of claim 8, wherein, in the independent production and test configuration:
the first chemical supply line is configured to provide the semiconductor processing chemical in the day tank to the production POU, and
the second chemical supply line is configured to provide the semiconductor processing chemical in the storage drum to the chemical test POU; and
wherein the method further comprises:
causing a first pump to provide the semiconductor processing chemical in the day tank to the production POU through the first chemical supply line; and
causing a second pump to provide the semiconductor processing chemical in the storage drum to the chemical test POU through the second chemical supply line.

10. The method of claim 8, wherein determining that the test is to be performed comprises:
determining that the test is to be performed based on receiving an instruction to perform the test.

11. The method of claim 8, wherein, in the independent production and test configuration:
the first chemical supply line is configured to provide the semiconductor processing chemical in the day tank to the chemical test POU, and
the second chemical supply line is configured to provide the semiconductor processing chemical in the storage drum to the production POU; and
wherein the method further comprises:
causing a first pump to provide the semiconductor processing chemical in the day tank to the chemical test POU through the first chemical supply line; and
causing a second pump to provide the semiconductor processing chemical in the storage drum to the production POU through the second chemical supply line.

12. The method of claim 8, further comprising:
determining to filter the semiconductor processing chemical in the storage drum;
identifying a configured quantity of filtration cycles for filtering the semiconductor processing chemical in the storage drum; and
causing a pump to circulate the semiconductor processing chemical in the storage drum through a filter included in the chemical dispensing system for a quantity of filtration cycles equal to the configured quantity of filtration cycles.

13. The method of claim 8, further comprising:
determining, based on the test, one or more parameters for the semiconductor processing chemical in the storage drum;
determining that the one or more parameters satisfy one or more test thresholds; and
causing, based on determining that the one or more parameters satisfies the one or more test thresholds, the chemical dispensing system to be transitioned from the independent production and test configuration to the production supply configuration,
wherein, in the production supply configuration, the first chemical supply line is connected to the day tank, the production POU, and the chemical test POU.

14. The method of claim 8, further comprising:
determining, based on a first test of the semiconductor processing chemical in the storage drum, one or more parameters for the semiconductor processing chemical in the storage drum;
determining that the one or more parameters do not satisfy one or more test thresholds;
causing the second chemical supply line to be flushed based on determining that the one or more parameters does not satisfy the one or more test thresholds; and
causing a second test to be performed for the semiconductor processing chemical in the storage drum after the second chemical supply line is flushed.

15. The method of claim 8, wherein causing the chemical dispensing system to be transitioned from the production supply configuration to the independent production and test configuration comprises at least one of:
closing one or more valves,
opening one or more valves,
activating one or more pumps,
deactivating one or more pumps,
reconfiguring one or more filters,
rearranging one or more filters,
reconfiguring one or more pipes or fittings, or
rearranging one or more pipes or fittings.

16. A device, comprising:
one or more memories; and
one or more processors, communicatively coupled to the one or more memories, configured to:
determine, based on determining that a new batch of a semiconductor processing chemical was added to a storage drum of a chemical dispensing system, that a test is to be performed for the semiconductor processing chemical in the storage drum; and
cause, based on determining that the test is to be performed, the chemical dispensing system to be transitioned from a production supply configuration to an independent production and test configuration,
wherein, in the independent production and test configuration, a first chemical supply line of the chemical dispensing system is configured to provide the semiconductor processing chemical in a day tank to a production point of use (POU) or a chemical test POU, and wherein, in the independent production and test configuration, a second chemical supply line of the chemical dispensing system is configured to provide the semiconductor processing chemical in the storage drum to the chemical test POU or the production POU based on whether the first chemical supply line is configured to provide the semiconductor processing chemical in the day tank to the production POU or the chemical test POU.

17. The device of claim 16, wherein the one or more processors are further configured to:
   cause a first pump to provide the semiconductor processing chemical in the day tank to the production POU through the first chemical supply line; and
   cause a second pump to provide the semiconductor processing chemical in the storage drum to the chemical test POU through the second chemical supply line.

18. The device of claim 16, wherein the one or more processors, to determine that the test is to be performed, are configured to:
   determine that the test is to be performed based on receiving an instruction to perform the test.

19. The device of claim 16, wherein the one or more processors are further configured to:
   cause a first pump to provide the semiconductor processing chemical in the day tank to the chemical test POU through the first chemical supply line; and
   cause a second pump to provide the semiconductor processing chemical in the storage drum to the production POU through the second chemical supply line.

20. The device of claim 16, wherein the one or more processors are further configured to:
   determine to filter the semiconductor processing chemical in the storage drum;
   identify a configured quantity of filtration cycles for filtering the semiconductor processing chemical in the storage drum; and
   cause a pump to circulate the semiconductor processing chemical in the storage drum through a filter included in the chemical dispensing system for a quantity of filtration cycles equal to the configured quantity of filtration cycles.

* * * * *